(12) United States Patent
Sawada et al.

(10) Patent No.: US 11,329,215 B2
(45) Date of Patent: May 10, 2022

(54) MAGNETIC MEMORY DEVICE

(71) Applicant: KIOXIA CORPORATION, Tokyo (JP)

(72) Inventors: Kazuya Sawada, Seoul (KR); Young Min Eeh, Seongnam-si (KR); Eiji Kitagawa, Seoul (KR); Taiga Isoda, Seoul (KR); Tadaaki Oikawa, Seoul (KR); Kenichi Yoshino, Seongnam-si (KR)

(73) Assignee: KIOXIA CORPORATION, Tokyo (JP)

( * ) Notice: Subject to any disclaimer, the term of this patent is extended or adjusted under 35 U.S.C. 154(b) by 230 days.

(21) Appl. No.: 16/816,961

(22) Filed: Mar. 12, 2020

(65) Prior Publication Data
US 2021/0083170 A1 Mar. 18, 2021

(30) Foreign Application Priority Data

Sep. 12, 2019 (JP) .............................. JP2019-166174

(51) Int. Cl.
*H01L 43/02* (2006.01)
*H01L 43/10* (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC ....... H01L 43/02; H01L 27/224; H01L 43/10; G11C 11/161; G11C 11/1659; G11C 11/1675
(Continued)

(56) References Cited

U.S. PATENT DOCUMENTS

| 7,556,869 B2 | 7/2009 | Fukushima et al. |
| 9,305,576 B2 | 4/2016 | Noma |

(Continued)

FOREIGN PATENT DOCUMENTS

| JP | S59164300 A | 9/1984 |
| JP | 3749649 B2 | 12/2005 |

(Continued)

OTHER PUBLICATIONS

U.S. Appl. No. 16/816,775; First Named Inventor: Masaru Toko; Title: "Magnetoresistive Memory Device"; filed Mar. 12, 2020.

*Primary Examiner* — Jami Valentine Miller
(74) *Attorney, Agent, or Firm* — Holtz, Holtz & Volek PC

(57) ABSTRACT

According to one embodiment, a magnetic memory device includes a substrate, a first layer stack, and a second layer stack at a same side of the first layer stack relative to the substrate, and farther than the first layer stack from the substrate. Each of the first and second layer stack includes a reference layer, a tunnel barrier layer provided in a direction relative to the reference layer, the direction being perpendicular to the substrate, a storage layer provided in the direction relative to the tunnel barrier layer, and a first nonmagnetic layer provided in the direction relative to the storage layer. A heat absorption rate of the first nonmagnetic layer of the first layer stack is lower than a heat absorption rate of the first nonmagnetic layer of the second layer stack.

20 Claims, 16 Drawing Sheets

(51) Int. Cl.
*G11C 11/16* (2006.01)
*H01L 27/22* (2006.01)
(52) U.S. Cl.
CPC ........ *G11C 11/1675* (2013.01); *H01L 27/224* (2013.01); *H01L 43/10* (2013.01)
(58) Field of Classification Search
USPC ........................................................ 257/421
See application file for complete search history.

(56) References Cited

U.S. PATENT DOCUMENTS

| | | | |
|---|---|---|---|
| 2009/0001442 A1* | 1/2009 | Ozawa | H01L 27/11521 |
| | | | 257/315 |
| 2018/0122825 A1* | 5/2018 | Lupino | G11C 11/1675 |
| 2018/0335486 A1 | 11/2018 | Lassalle-Balier et al. | |
| 2020/0091227 A1 | 3/2020 | Iwayama et al. | |

FOREIGN PATENT DOCUMENTS

| | | | | |
|---|---|---|---|---|
| JP | | 4482667 B2 | 4/2010 | |
| WO | WO-2020239390 A1 * | | 12/2020 | ........... B30B 15/308 |

* cited by examiner

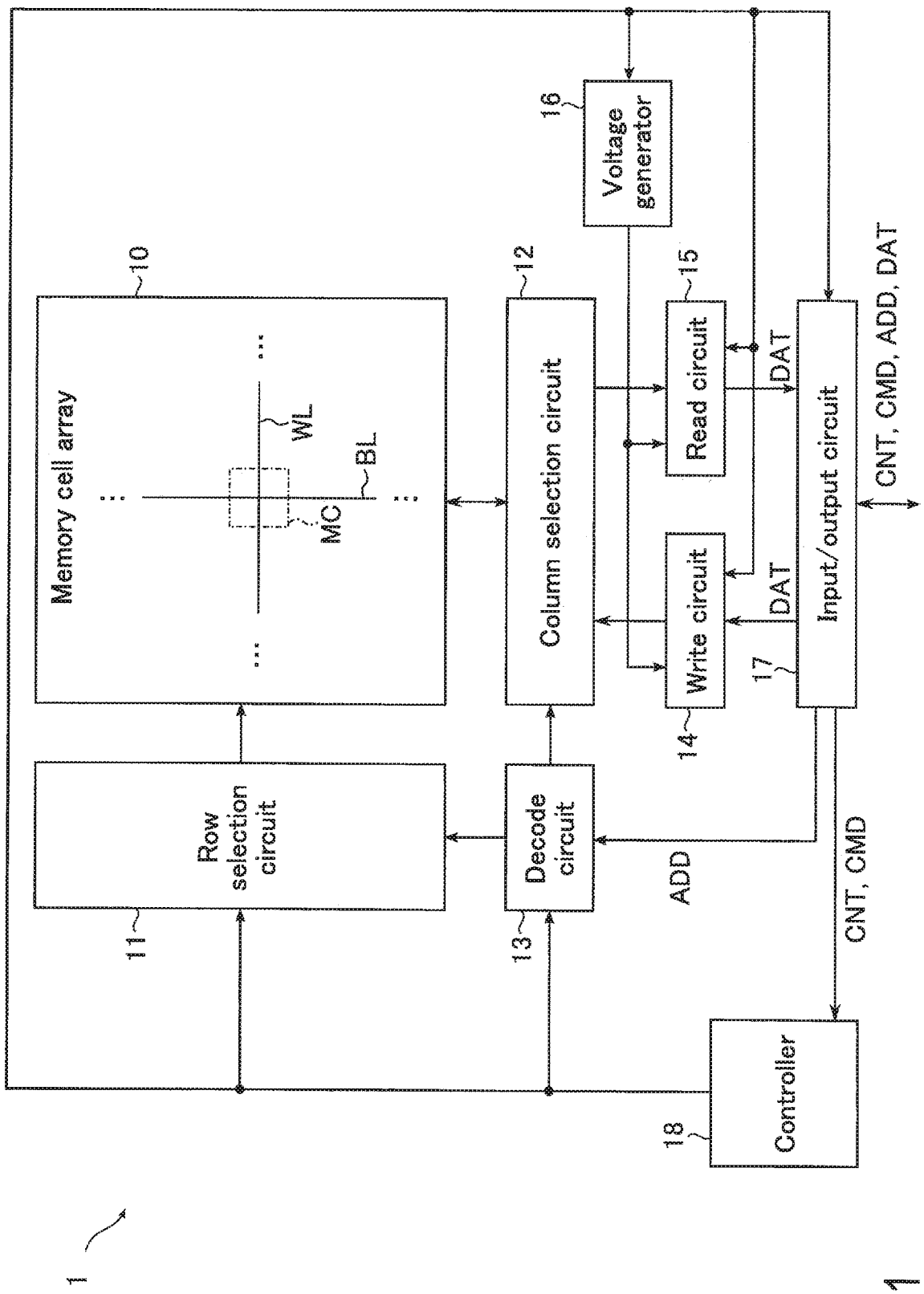
F I G. 1

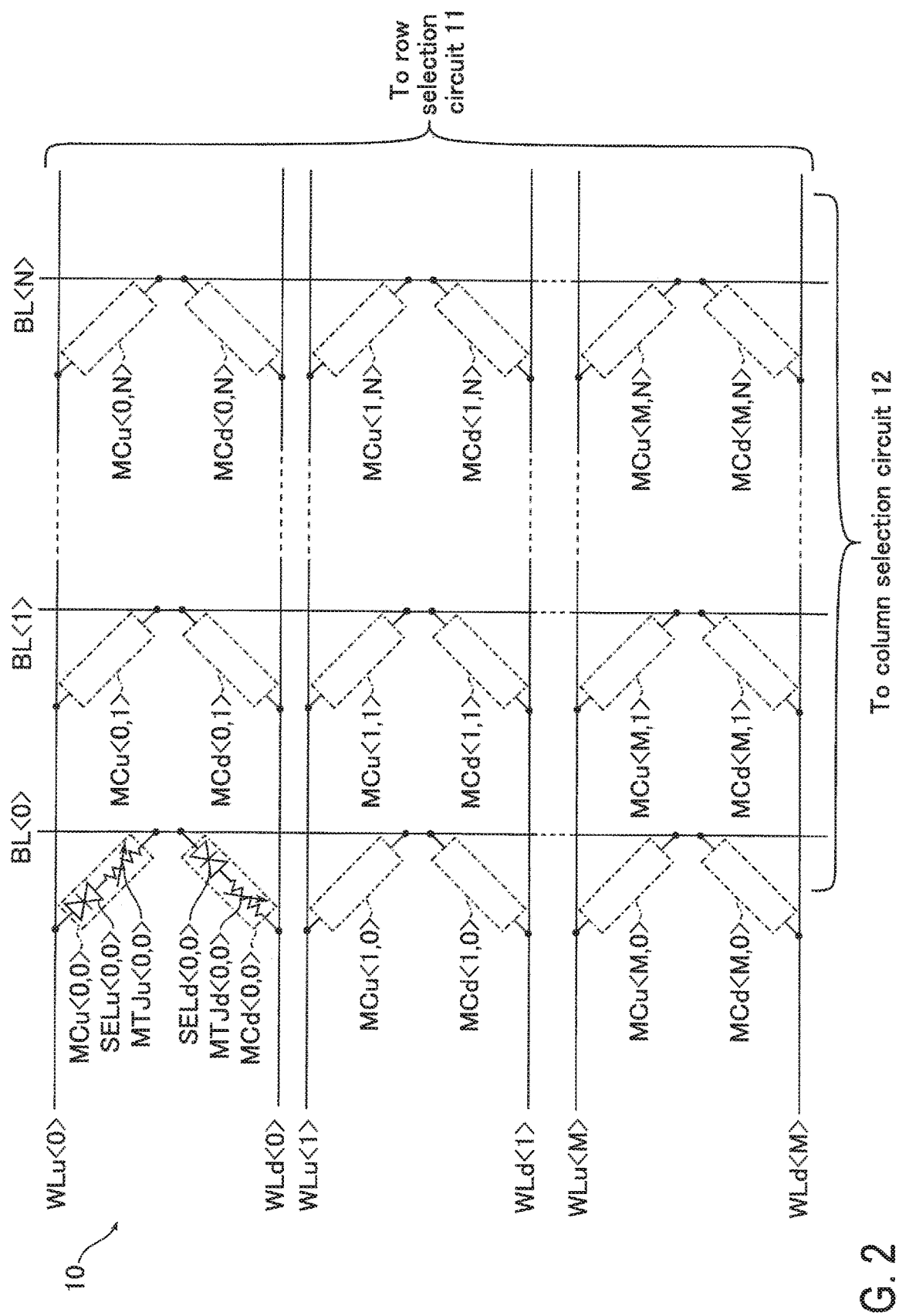
F I G. 2

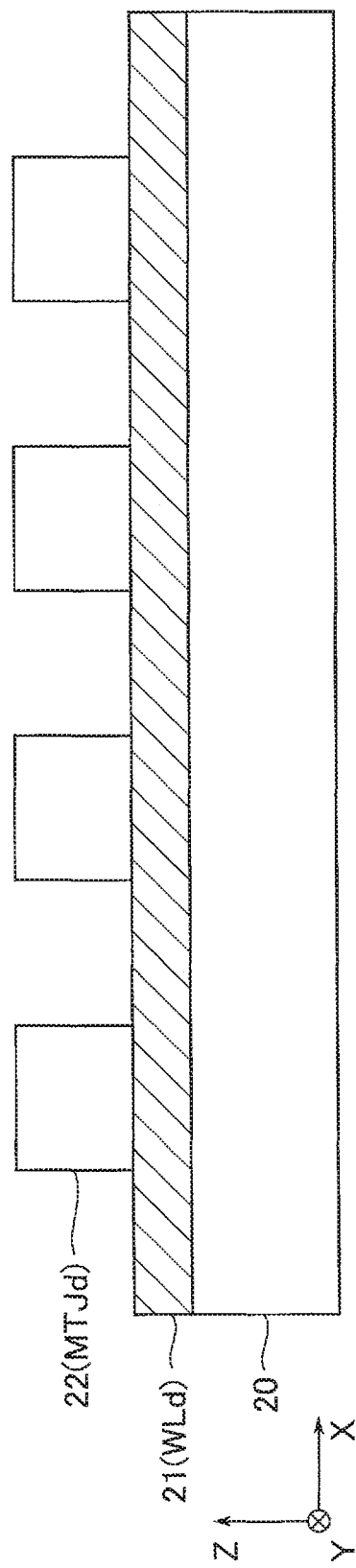
F I G. 6

MAGNETIC MEMORY DEVICE

CROSS-REFERENCE TO RELATED APPLICATIONS

This application is based upon and claims the benefit of priority from Japanese Patent Application No. 2019-166174, filed Sep. 12, 2019, the entire contents of which are incorporated herein by reference.

FIELD

Embodiments described herein relate generally to a magnetic memory device.

BACKGROUND

A magnetic memory device (magnetoresistive random access memory (MRAM)) which adopts a magnetoresistive effect element as a memory element is known.

BRIEF DESCRIPTION OF THE DRAWINGS

FIG. 1 is a block diagram showing a configuration of a magnetic memory device according to a first embodiment.

FIG. 2 is a circuit diagram showing a configuration of a memory cell array in the magnetic memory device according to the first embodiment.

FIG. 6 is a schematic diagram showing a manufacturing method of the memory cell array of the magnetic memory device according to the first embodiment.

DETAILED DESCRIPTION

Figure 3:
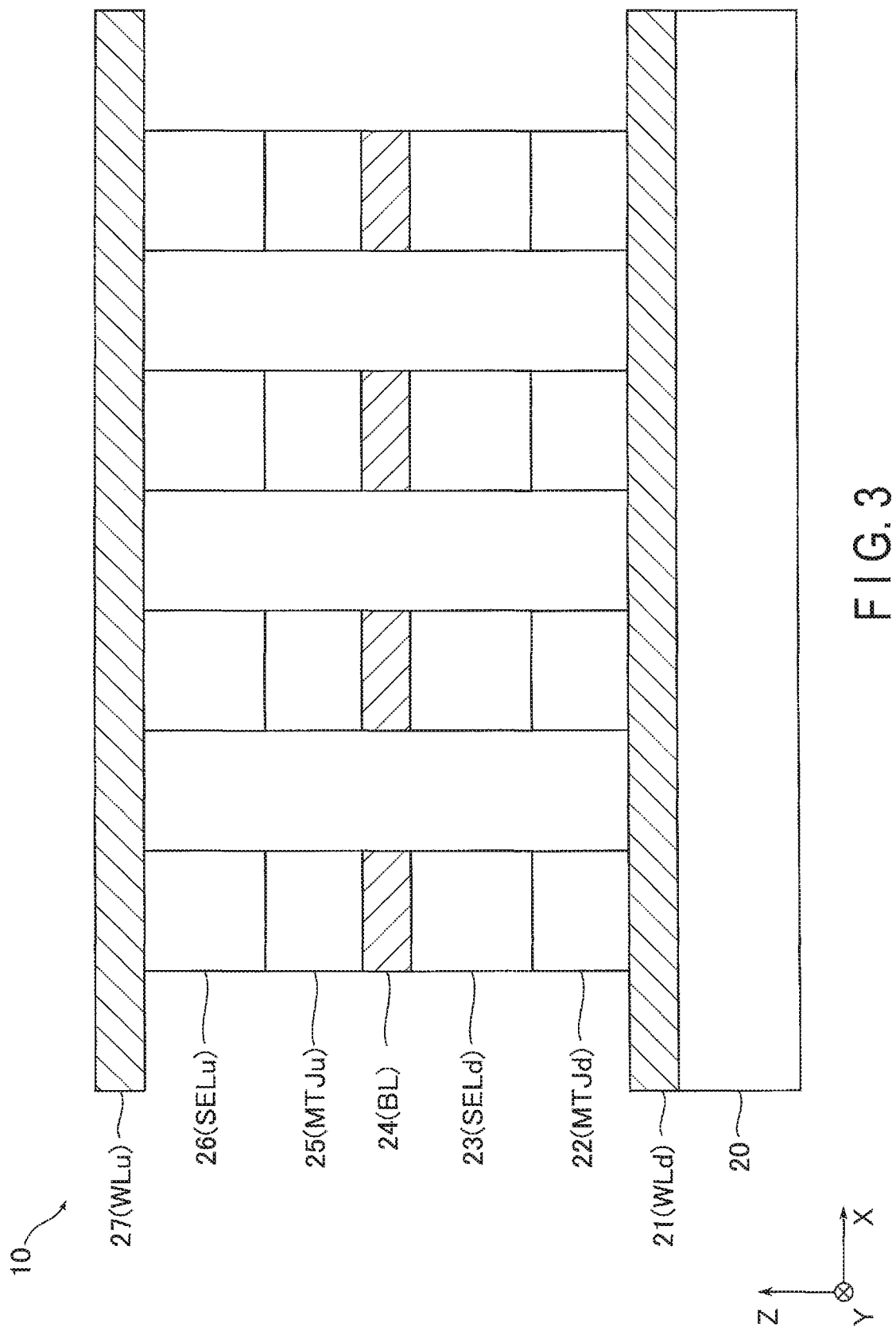
FIG. 3 is a cross section showing a configuration of the memory cell array in the magnetic memory device according to the first embodiment.

In general, according to one embodiment, a magnetic memory device includes a substrate, a first layer stack, and a second layer stack at a same side of the first layer stack relative to the substrate, and farther than the first layer stack from the substrate. Each of the first layer stack and the second layer stack includes a reference layer, a tunnel barrier layer provided in a direction relative to the reference layer, the direction being perpendicular to the substrate, a storage layer provided in the direction relative to the tunnel barrier layer, and a first nonmagnetic layer provided in the direction relative to the storage layer. A heat absorption rate of the first nonmagnetic layer of the first layer stack is lower than a heat absorption rate of the first nonmagnetic layer of the second layer stack.

The embodiments of the present invention will be explained with reference to the drawings. In the following explanation, components having the same functions and configurations will be referred to by the same reference symbol. In case structural components having the same reference symbols need to be distinguished from each other, letters or numerals may be added to the symbols. If the structural components need not be distinguished particularly from each other, only the common reference symbols are used, without additional letters or numerals. The additional letters or numerals are not limited to a superscript or subscript, but may be lower-case alphabetic characters attached to the end of a reference symbol, and indices indicating the arrangement order.

1. First Embodiment

A magnetic memory device according to a first embodiment will be explained. The magnetic device according to the first embodiment is, for example, a perpendicular magnetization-type magnetic memory device in which an element having a magnetoresistive effect provided by a magnetic tunnel junction (MTJ) (such an element may be called an MTJ element or a magnetoresistive effect element) as a resistance change element.

1.1 Configuration

First, a configuration of the magnetic memory device according to the first embodiment is explained.

1.1.1 Magnetic Memory Device

FIG. 1 is a block diagram showing a configuration of a magnetic memory device according to the first embodiment. A magnetic memory device 1 includes a memory cell array 10, a row selection circuit 11, a column selection circuit 12, a decode circuit 13, a write circuit 14, a read circuit 15, a voltage generator 16, an input/output circuit 17, and a controller 18, as illustrated in FIG. 1.

The memory cell array 10 contains a plurality of memory cells MC, each of which is associated with a pair of one row and one column. In particular, the memory cells MC of the same row are coupled to the same word line WL, and the memory cells MC of the same column are coupled to the same bit line BL.

The row selection circuit 11 is coupled to the memory cell array 10 by way of word lines WL. The row selection circuit 11 receives decoding results (row address) of an address ADD from the decode circuit 13. The row selection circuit 11 sets a word line WL corresponding to the row indicated by the decoding results of the address ADD to a selected state. Hereinafter, a word line WL that is set to a selected state will be referred to as a selected word line WL. Word lines WL other than the selected word line WL will be referred to as non-selected word lines WL.

The column selection circuit 12 is coupled to the memory cell array 10 by way of the bit line BL. The column selection circuit 12 receives decoding results (column address) of the address ADD from the decode circuit 13. The column selection circuit 12 sets a column indicated by the decoding results of the address ADD to a selected state. Hereinafter, a bit line BL that is set to a selected state will be referred to as a selected bit line BL. Bit lines BL other than the selected bit line BL will be referred to as non-selected bit lines BL.

The decode circuit 13 decodes the address ADD received from the input/output circuit 17. The decode circuit 13 supplies the decoding results of the address ADD to the row selection circuit 11 and column selection circuit 12. The address ADD includes addresses of a column and row that are to be selected.

The write circuit 14 writes data to memory cells MC. The write circuit 14 may include a write driver (not shown).

The read circuit 15 reads data from memory cells MC. The read circuit 15 may include a sense amplifier (not shown).

The voltage generator 16 generates voltages for the operations of the memory cell array 10 using a power supply voltage supplied from the outside (not shown) of the magnetic memory device 1. For example, the voltage generator 16 generates voltages required for a write operation and outputs them to the write circuit 14. The voltage generator 16 also generates voltages required for a read operation and outputs them to the read circuit 15.

The input/output circuit 17 transfers an address ADD received from the outside of the magnetic memory device 1, to the decode circuit 13. The input/output circuit 17 also transfers a command CMD received from the outside of the magnetic memory device 1, to the controller 18. The input/output circuit 17 transmits and receives various control signals CNT with respect to the outside of the magnetic memory device 1 and the controller 18. The input/output circuit 17 transfers to the write circuit 14 the data DAT received from the outside of the magnetic memory device 1, and outputs to the outside of the magnetic memory device 1 the data DAT transferred from the read circuit 15.

The controller 18 controls the operations of the row selection circuit 11, column selection circuit 12, decode circuit 13, write circuit 14, read circuit 15, voltage generator 16, and input/output circuit 17 in the magnetic memory device 1, in accordance with the control signal CNT and command CMD.

1.1.2 Memory Cell Array

Next, a configuration of the memory cell array of the magnetic memory device according to the first embodiment is explained with reference to FIG. 2. The circuit diagram of FIG. 2 shows a configuration of the memory cell array of the magnetic memory device according to the first embodiment. In FIG. 2, the word lines WL are classified by a lower-case alphabetic character ("u" or "d") and an angle-bracketed index (e.g., <0>).

Memory cells MC (MCu and MCd) are arranged to form a matrix in the memory cell array 10 as shown in FIG. 2, each of which is associated with a pair of one of the bit lines BL (BL<0>, BL<1>, ..., BL<N>)) and one of the word lines WLd (WLd<0>, WLd<1>, ..., WLd<M>) and WLu (WLu<0>, WLu<1>, ..., WLu<M>) (where M and N are integers). In other words, a memory cell MCd<i,j> ($0 \le i \le M$, $0 \le j \le N$) is coupled between the word line WLd<i> and bit line BL<j>, and the memory cell MCu<i,j> is coupled to the word line WLu<i> and bit line BL<j>.

The alphabetic characters "d" and "u" are attached simply for the sake of convenience to indicate a memory cell MC being arranged among a plurality of memory cells MC, for example, below or above a bit line BL. The three-dimensional configuration of the memory cell array 10 will be described later.

The memory cell MCd<i,j> includes a switching element SELd<i,j> and a magnetoresistive effect element MTJd<i,j> that are coupled in series with each other. The memory cell MCu<i,j> includes a switching element SELu<i,j> and a magnetoresistive effect element MTJu<i,j> that are coupled in series with each other.

The switching element SEL is provided with a function of switching, at the time of writing and reading data to and from its corresponding magnetoresistive effect element MTJ, to control the current supply to the magnetoresistive effect element MTJ. In particular, when the voltage applied to a memory cell MC is lower than the threshold voltage Vth, the switching element SEL of the memory cell MC serves as a highly resistive insulator and thereby interrupts the current (switching to an OFF state), while when the voltage exceeds the threshold voltage Vth, it serves as a low resistive conductor and thereby passes the current (switching to an ON state). That is, the switching element SEL is provided with a function of switching between interruption and passing of the current, in accordance with the voltage applied to the memory cell MC regardless of the direction of the current flow.

The switching element SEL may be a two-terminal type switching element. When the voltage applied between the two terminals is lower than the threshold voltage, this switching element is in a "high resistance" state, being electrically non-conductive, for example. When the voltage applied between the two terminals is higher than the threshold voltage, the switching element is in a "low resistance" state, being electrically conductive, for example. The switching element may be provided with this function, regardless of the polarity of the voltage. This switching element may contain one or more types of chalcogen elements selected from a group of tellurium (Te), selenium (Se) and sulfur (S). Alternatively, the switching element may contain chalcogenide, which is a compound containing any of the above chalcogen elements. The switching element may also contain one or more types of elements selected from a group of boron (B), aluminum (Al), gallium (Ga), indium (In), carbon (C), silicon (Si), germanium (Ge), tin (Sn), arsenic (As), phosphorus (P), antimony (Sb), titanium (Ti), and bismuth (Bi). In particular, this switching element may contain at least two elements selected from a group of germanium (Ge), antimony (Sb), tellurium (Te), titanium (Ti), arsenic (As), indium (In), and bismuth (Bi). In addition, this switching element may contain an oxide of at least one element selected from titanium (Ti), vanadium (V), chrome (Cr), niobium (Nb), molybdenum (Mo), hafnium (Hf), and tungsten (W).

With the current supply controlled by the switching element SEL, the resistance value of the magnetoresistive effect element MTJ can be switched between the low resistance state and high resistance state. The magnetoresistive effect element MTJ is designed to be data-writable in accordance with the change of the resistance state of the element, and functions as a readable memory element by storing the written data in a non-volatile manner.

Figure 4:
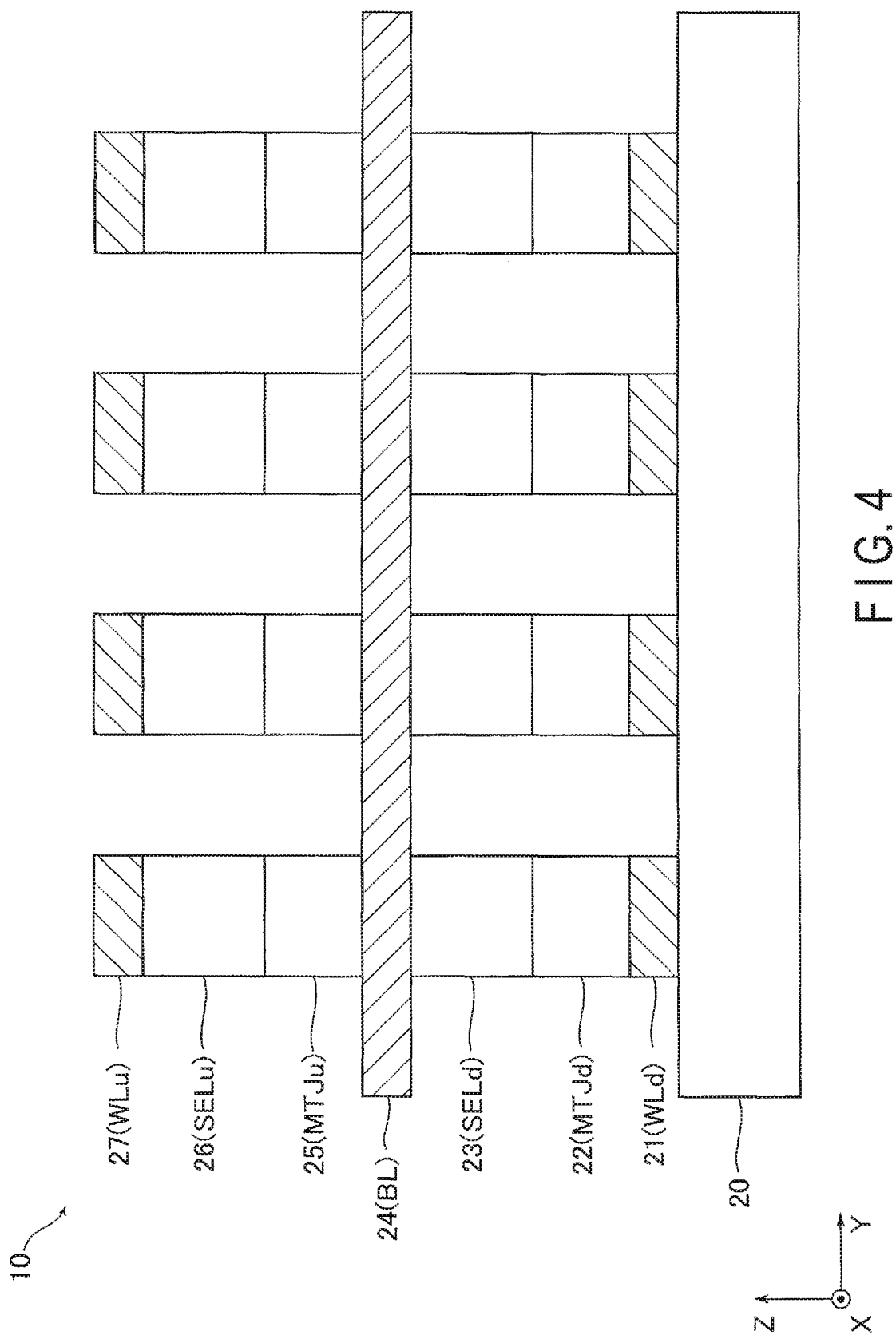
FIG. 4 is a cross section showing a configuration of the memory cell array in the magnetic memory device according to the first embodiment.

Next, a cross-sectional configuration of the memory cell array 10 is explained with reference to FIGS. 3 and 4. To explain the configuration of the memory cell array in the magnetic memory device according to the first embodiment, FIGS. 3 and 4 present exemplary cross sections thereof. The cross sections of the memory cell array 10 viewed from different directions that intersect each other are shown in FIGS. 3 and 4.

As illustrated in FIGS. 3 and 4, the memory cell array 10 is arranged on a semiconductor substrate 20. In the following explanation, a plane parallel to the surface of the semiconductor substrate 20 will be referred to as an XY plane, and the axis perpendicular to the XY plane will be referred to as a Z-axis. A positive direction of the Z-axis may be a direction away or approaching from the surface of the semiconductor substrate 20. On the XY plane, the axis extending along the word line WL will be referred to as an X-axis, and the axis extending along the bit line BL will be referred to as a Y-axis. FIGS. 3 and 4 present the cross sections of the memory cell array 10 when viewed along the Y-axis and X-axis, respectively.

A plurality of conductors 21 are arranged on the top surface of the semiconductor substrate 20. The conductors 21 are conductive and function as word lines WLd. The conductors 21 may be aligned along the Y-axis, each extending along the X-axis. The conductors 21 in FIGS. 3 and 4 are arranged on the semiconductor substrate 20, but the arrangement is not limited thereto. The conductors 21 may be arranged above the semiconductor substrate 20 without being in contact with the semiconductor substrate 20.

A plurality of elements 22 are arranged on the top surface of a conductor 21 to individually function as a magnetoresistive effect element MTJd. The elements 22 on the conductor 21 may be aligned along the X-axis. In other words, the elements 22 are arranged along the X-axis on one conductor 21 and are commonly coupled thereto. The configuration of an element 22 will be described later in detail.

An element 23 is provided on the top surface of each of the elements 22 so as to function as a switching element SELd. The top surface of the elements 23 is coupled to one of the conductors 24. The conductors 24 are conductive, and function as bit lines BL. The conductors 24 are aligned along the X-axis, each extending along the Y-axis. That is, the elements 23 aligned along the Y-axis are commonly coupled to one conductor 24. In FIGS. 3 and 4, individual elements 23 are arranged on the elements 22 and on the conductor 24, but the arrangement is not limited thereto. Each element 23 may be coupled to the elements 22 and conductor 24 with conductive contact plugs (not shown) interposed between.

A plurality of elements 25 are arranged on the top surface of the conductor 24 to individually function as a magnetoresistive effect element MTJu. The elements 25 on the conductor 24 may be aligned along the Y-axis. That is, the elements 25 aligned along the Y-axis are commonly coupled to one conductor 24. The elements 25 may have a configuration similar to the elements 22.

An element 26 is arranged on the top surface of each of the elements 25 to function as a switching element SELu. The top surface of the element 26 is coupled to one of the conductors 27. The conductors 27 are conductive and function as word lines WLu. The conductors 27 may be aligned along the Y-axis, each extending along the X-axis. That is, the elements 26 aligned along the X-axis are commonly coupled to one conductor 27. In FIGS. 3 and 4, individual elements 26 are arranged on the elements 25 and on the conductor 27, but the arrangement is not limited thereto. The elements 26 may be individually coupled to the elements 25 and conductor 27 with conductive contact plugs interposed between (not shown).

With the above arrangement, a pair of word lines WLd and WLu corresponds to one bit line BL in the memory cell array 10. Furthermore, in the memory cell array 10, a memory cell MCd is arranged between a word line WLd and a bit line BL, and a memory cell MCu is arranged between a bit line BL and a word line WLu. This means that the memory cell array 10 has a structure of memory cells MC arranged at different levels along the Z-axis. In the cell structure of FIGS. 3 and 4, the memory cells MCd correspond to the lower level, and the memory cells MCu correspond to the upper level. Of the two memory cells MC coupled commonly to a single bit line BL, the memory cell MC in the upper level with respect to the bit line BL corresponds to a memory cell MCu with the alphabetic character "u" attached, while the memory cell MC in the lower level corresponds to a memory cell MCd with "d" attached.

1.1.3 Magnetoresistive Effect Element

Figure 5:
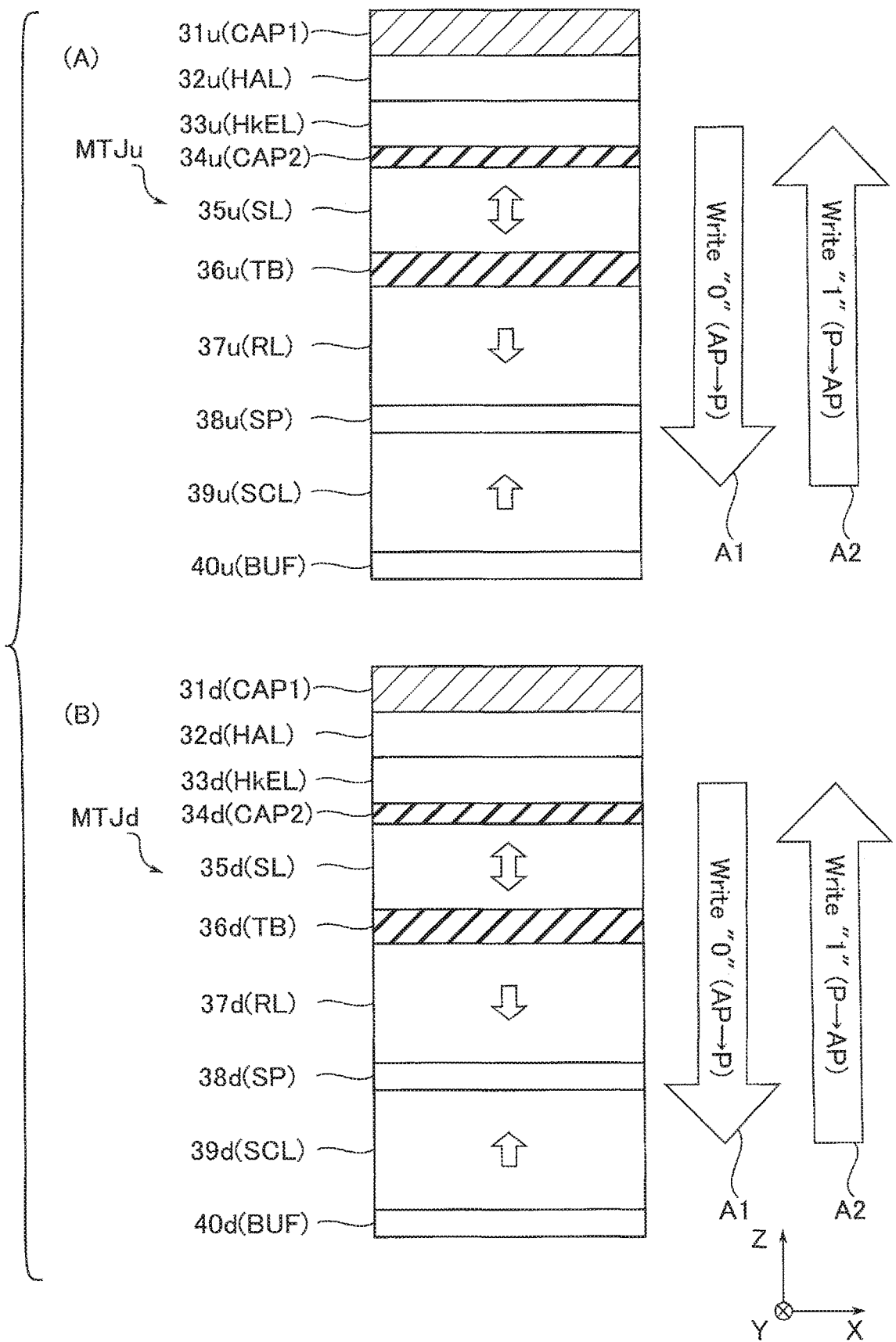
FIG. 5 is a cross section showing a configuration of a magnetoresistive effect element in the magnetic memory device according to the first embodiment.

Next, a configuration of magnetoresistive effect elements of the magnetic memory device according to the first embodiment is explained with reference to FIG. 5. In this drawing, a cross section of a configuration of the magnetoresistive effect elements in the magnetic memory device according to the first embodiment is presented. FIG. 5 provides an exemplary cross section of the magnetoresistive effect elements MTJu and MTJd in FIGS. 3 and 4, taken along a plane perpendicular to the Z-axis (e.g., XZ plane). The magnetoresistive effect elements MTJu and MTJd correspond to (A) and (B), respectively, in FIG. 5.

As illustrated in FIG. 5, the magnetoresistive effect element MTJu may include a nonmagnet 31$u$ functioning as a capping layer CAP1, a nonmagnet 32$u$ functioning as a heat absorption layer HAL, a nonmagnet 33$u$ functioning as a magnetic anisotropy enhancement layer (Hk enhancement layer) HkEL, a nonmagnet 34$u$ functioning as a capping layer CAP2, a ferromagnet 35$u$ functioning as a storage layer SL, a nonmagnet 36$u$ functioning as a tunnel barrier layer TB, a ferromagnet 37$u$ functioning as a reference layer RL, a nonmagnet 38$u$ functioning as a spacer layer SP, a ferromagnet 39$u$ functioning as a shift cancelling layer SCL, and a nonmagnet 40$u$ functioning as a buffer layer BUF. The magnetoresistive effect element MTJd may include a nonmagnet 31$d$ functioning as a capping layer CAP1, a nonmagnet 32$d$ functioning as a heat absorption layer HAL, a nonmagnet 33$d$ functioning as a Hk enhancement layer HkEL, a nonmagnet 34$d$ functioning as a capping layer CAP2, a ferromagnet 35$d$ functioning as a storage layer SL, a nonmagnet 36$d$ functioning as a tunnel barrier layer TB, a ferromagnet 37$d$ functioning as a reference layer RL, a nonmagnet 38$d$ functioning as a spacer layer SP, a ferromagnet 39$d$ functioning as a shift cancelling layer SCL, and a nonmagnet 40$d$ functioning as a buffer layer BUF.

The magnetoresistive effect elements MTJu and MTJd have the same configuration with regard to the capping layers CAP1 and CAP2, Hk enhancement layer HkEL, storage layer SL, tunnel barrier layer TB, reference layer RL, spacer layer SP, shift cancelling layer SCL, and buffer layer BUF. On the other hand, the magnetoresistive effect element MTJu and the magnetoresistive effect element MTJd have different configurations with regard to the heat absorption layers HAL.

In the magnetoresistive effect element MTJu, the nonmagnet 40u, ferromagnet 39u, nonmagnet 38u, ferromagnet 37u, nonmagnet 36u, ferromagnet 35u, nonmagnet 34u, nonmagnet 33u, nonmagnet 32u, and nonmagnet 31u may be stacked in the order from the side of the bit line BL to the side of the word line WLu (in the Z-axis direction perpendicular to the semiconductor substrate 20). In the magnetoresistive effect element MTJd, the nonmagnet 40d, ferromagnet 39d, nonmagnet 38d, ferromagnet 37d, nonmagnet 36d, ferromagnet 35d, nonmagnet 34d, nonmagnet 33d, nonmagnet 32d, and nonmagnet 31d may be stacked in the order from the side of the word line WLd to the side of the bit line BL (in the Z-axis direction). The magnetoresistive effect elements MTJu and MTJd may function as perpendicular magnetization type MTJ elements, in which the magnetization directions of the magnets that constitute the magnetoresistive effect elements MTJu and MTJd, respectively, are perpendicular to the film plane.

As described above, part of the layers of the magnetoresistive effect elements MTJu and MTJd have different configurations (i.e., materials and film thicknesses); however, the same number of layers may be included in the magnetoresistive effect elements MTJu and MTJd. The configuration is not limited to the above. As long as the number of layers is the same, the magnetoresistive effect elements MTJu and MTJd may further include layers (not shown) between any adjacent layers of the above layers 31u to 40u and between any adjacent layers of the above layers 31d to 40d.

The nonmagnets 31u and 31d are non-magnetic conductive films, both functioning as an upper electrode that enhances the electric connectivity with the word line WLu and bit line BL, respectively. The nonmagnets 31u and 31d include high-melting-point metal. The high-melting-point metal may indicate a material that demonstrates a melting point higher than iron (Fe) and cobalt (Co), which is at least one element selected from zirconium (Zr), hafnium (Hf), tungsten (W), chrome (Cr), molybdenum (Mo), niobium (Nb), titanium (Ti), tantalum (Ta), vanadium (V), ruthenium (Ru), and platinum (Pt).

Nonmagnets 32u and 32d having different heat absorption rates are employed to adjust the amount of heat flowing into the magnetoresistive effect elements MTJu and MTJd, respectively, when manufacturing the memory cell array 10. In particular, the heat absorption rate of the nonmagnet 32u is set higher than that of the nonmagnet 32d. That is, when a certain amount of heat is applied to the memory cell array 10, the nonmagnet 32u absorbs more heat than the nonmagnet 32d so that the temperature of the magnetoresistive effect element MTJu becomes higher than the temperature of the magnetoresistive effect element MTJd. The heat absorption rate is defined together with the optical reflectivity, given by (reflectivity)+(heat absorption rate)=1. From the viewpoint of preventing the resistances of the magnetoresistive effect elements MTJu and MTJd from increasing, the nonmagnets 32u and 32d should be formed of a material having approximately the same resistivity as the nonmagnets 31u and 31d. For this reason, the nonmagnets 32u and 32d may each include at least one element selected from zirconium (Zr), hafnium (Hf), tungsten (W), chrome (Cr), molybdenum (Mo), niobium (Nb), titanium (Ti), tantalum (Ta), vanadium (V), ruthenium (Ru), and platinum (Pt).

When the nonmagnet 32d is formed n layers apart from the nonmagnet 36d, the nonmagnet 32u is also formed n layers apart from the nonmagnet 36u (where n is an integer larger than or equal to 1). In the example of FIG. 5, the nonmagnets 32u and 32d are formed three layers apart from the nonmagnets 36u and 36d along the Z-axis, respectively.

The nonmagnets 33u and 33d may include at least one element selected from iridium (Ir), ruthenium (Ru), rhodium (Rh), molybdenum (Mo), iron (Fe), and cobalt (Co), having a function of enhancing the perpendicular magnetic anisotropy of the corresponding ferromagnets 35u and 35d.

As described above, for the nonmagnets 32u and 32d designed to have different heat absorption rates, elements included in the film and film thicknesses are selected so as to be different from each other. Thus, nonmagnets 32u and 32d having different elements and/or thicknesses can be obtained. For example, if the nonmagnet 31d, nonmagnet 32d, and nonmagnet 33d mainly contain ruthenium (Ru), the nonmagnet 31u, nonmagnet 32u, and nonmagnet 33u may mainly contain ruthenium (Ru), tantalum (Ta) and ruthenium (Ru), respectively. With tantalum (Ta) having a greater heat absorption rate than ruthenium (Ru), the heat absorption rate of the magnetoresistive effect element MTJu can be set higher than the heat absorption rate of the magnetoresistive effect element MTJd.

When the nonmagnet 31d, nonmagnet 32d, and nonmagnet 33d mainly contain ruthenium (Ru), the compositions of the nonmagnet 31d, 32d and 33d of the magnetoresistive effect element MTJd become similar to each other, which means that the heat absorption layer HAL is indistinguishable from other layers (i.e., the capping layer CAP1 and Hk enhancement layer HkEL in the above example) in the structure of the magnetoresistive effect element MTJd. In other words, the magnetoresistive effect element MTJd substantially may not contain a layer named "heat absorption layer HAL". The present embodiment therefore includes a structure in which the magnetoresistive effect element MTJd does not contain a heat absorption layer HAL, while the magnetoresistive effect element MTJu does contain a heat absorption layer HAL. The present embodiment further includes a structure in which the magnetoresistive effect element MTJu does not contain a heat absorption layer HAL, while the magnetoresistive effect element MTJd does contain a heat absorption layer HAL.

The nonmagnets 34u and 34d each contain a nonmagnetic oxide, having functions of enhancing the perpendicular magnetic anisotropy of the ferromagnets 35u and 35d, preventing the damping coefficient of the ferromagnets 35u and 35d from increasing, and preventing impurities from being diffused into the ferromagnets 35u and 35d during the crystallization process of the ferromagnets 35u and 35d. In particular, the nonmagnets 34u and 34d contain magnesium oxide (MgO) or rare-earth oxide. The nonmagnets 34u and 34d containing magnesium oxide (MgO) are provided with a body-centered cubic (bcc) crystalline structure (a NaCl crystalline structure having a surface oriented in a (001) surface plane), and therefore serves as an excellent seed, or core material, for growing a crystalline film from the interface between the ferromagnet 35u and the nonmagnet 34u, and the interface between the ferromagnet 35d and the nonmagnet 34d, respectively. The nonmagnets 34u and 34d containing a rare-earth oxide each absorb boron (B) from the ferromagnets 35u and 35d, thereby contributing excellent crystallization of the ferromagnets 35u and 35d. In general, oxides have insulation properties. From the viewpoint of lowering the resistance, it is preferable that the film thickness of the nonmagnets 34u and 34d be no greater than several nanometers (rm).

The ferromagnets 35u and 35d have an easy magnetization axis in the direction perpendicular to the film plane, exhibiting ferromagnetism with the magnetization direction along the Z-axis toward either the bit line BL side or the word line WL side. The ferromagnets 35u and 35d contain at least one of iron (Fe), cobalt (Co) and nickel (Ni), and may further contain boron (B). Specifically, the ferromagnets 35u and 35d may contain iron cobalt boride (FeCoB) or iron boride (FeB), having a body-centered cubic crystalline structure.

The nonmagnets 36u and 36d are non-magnetic insulators, containing magnesium oxide (MgO), for example. In the crystallization process of the ferromagnets 35u and 35d, the nonmagnets 36u and 36d each serve as a seed or a core for growing a crystalline film from the interface between the nonmagnet 36u and ferromagnet 35u and the interface between the nonmagnet 36d and ferromagnet 35d. The nonmagnet 36u arranged between the ferromagnet 35u and ferromagnet 37u and the nonmagnet 36d arranged between the ferromagnet 35d and ferromagnet 37d each form a magnetic tunnel junction together with these adjacent ferromagnets.

The ferromagnets 37u and 37d have an easy magnetization axis in the direction perpendicular to the film plane, exhibiting ferromagnetism having a magnetization direction along the Z-axis toward either the bit line BL side or the word line WL side. The ferromagnets 37u and 37d contain at least one of iron (Fe), cobalt (Co) and nickel (Ni), and may further contain boron (B). Specifically, the ferromagnets 37u and 37d may contain iron cobalt boride (FeCoB) or iron boride (FeB), having a body-centered cubic crystalline structure. The ferromagnets 37u and 37d have a fixed magnetization direction, as shown in FIG. 5, where the direction is indicated as being toward the ferromagnets 39u and 39d in this example. "Fixed magnetization direction" indicates the magnetization direction being unchanged even by a current (spin torque) large enough to reverse the magnetization direction of the ferromagnets 35u and 35d.

Each of the ferromagnets 37u and 37d may be a layer stack including a plurality of layers, although they are not shown in FIG. 5. In particular, the layer stacks of the ferromagnets 37u and 37d may include the layer of the above discussed material as an interface layer between the ferromagnet 37u and the nonmagnet 36u, and an interface layer between the ferromagnet 37d and the nonmagnet 36d, and further include a ferromagnet with a non-magnetic conductor interposed between. The non-magnetic conductor may contain at least one metal selected from tantalum (Ta), hafnium (Hf), tungsten (W), zirconium (Zr), molybdenum (Mo), niobium (Nb) and titanium (Ti), or a nitride or oxide of such metals. The additional ferromagnet may include at least one selected from a multi-layer film (Co/Pt multi-layer film) containing cobalt (Co) and platinum (Pt), a multi-layer film (Co/Ni multi-layer film) containing cobalt (Co) and nickel (Ni), and a multi-layer film (Co/Pd multi-layer film) containing cobalt (Co) and palladium (Pd).

The nonmagnets 38u and 38d are nonmagnetic conductors, and may include at least one element selected from ruthenium (Ru), osmium (Os), iridium (Ir), vanadium (V), and chrome (Cr).

The ferromagnets 39u and 39d have an easy magnetization axis in the direction perpendicular to the film plane, and are ferromagnetic in a magnetization direction along the Z-axis toward either the bit line BL side or the word line WL side. In the same manner as the ferromagnets 37u and 37d, the ferromagnets 39u and 39d have a fixed magnetization direction. In the example of FIG. 5, the magnetization direction is indicated as being toward the ferromagnets 37u and 37d. The ferromagnets 39u and 39d include at least one alloy selected from cobalt platinum (CoPt), cobalt nickel (CoNi), and cobalt palladium (CoPd). In the same manner as the ferromagnets 37u and 37d, the ferromagnets 39u and 39d may be a layer stack including a plurality of layers. If this is the case, the ferromagnets 39u and 39d may include at least one selected from a multi-layer film (Co/Pt multi-layer film) containing cobalt (Co) and platinum (Pt), a multi-layer film (Co/Ni multi-layer film) containing cobalt (Co) and nickel (Ni), and a multi-layer film (Co/Pd multi-layer film) containing cobalt (Co) and palladium (Pd).

The ferromagnets 37u and 39u, and ferromagnets 37d and 39d are antiferromagnetically coupled to each other by the nonmagnets 38u and 38d, respectively. In other words, the ferromagnets 37u and 39u are coupled so as to have magnetization directions that are anti-parallel to each other, and the ferromagnets 37d and 39d are coupled in the same manner. In the example of FIG. 5, the magnetization directions of the ferromagnets 37u and 39u face each other, and the magnetization directions of the ferromagnets 37d and 39d face each other. Such a structure of the ferromagnet 37u, nonmagnet 38u and ferromagnet 39u coupled together and a structure of the ferromagnet 37u, nonmagnet 38u and ferromagnet 39u coupled together are referred to as synthetic anti-ferromagnetic (SAF) structures. In this manner, the ferromagnet 39u can cancel the influence of the stray field of the ferromagnet 37u on the magnetization direction of the ferromagnet 35u, and the ferromagnet 39d can cancel the influence of the stray field of the ferromagnet 37d on the magnetization direction of the ferromagnet 35d.

The nonmagnets 40u and 40d are non-magnetic conductors, both functioning as an electrode that enhances the electric connectivity with the bit line BL and word line WLd. The nonmagnet 40u and 40d may include at least one element selected from zirconium (Zr), hafnium (Hf), tungsten (W), chrome (Cr), molybdenum (Mo), niobium (Nb), titanium (Ti), tantalum (Ta), vanadium (V), iridium (Ir), ruthenium (Ru), rhodium (Rh), and platinum (Pt), and may further include boron (B).

According to the first embodiment, a spin injection write scheme is adopted in which a write current flows directly into the magnetoresistive effect elements MTJ and a spin torque is injected by this write current into the storage layer SL and reference layer RL, thereby controlling the magnetization directions of the storage layer SL and the reference layer RL. The magnetoresistive effect elements MTJ may be either in the low resistance state or high resistance state, depending on whether the magnetization directions of the storage layer SL and reference layer RL are parallel or anti-parallel to each other.

When a certain write current Ic0 is passed to the magnetoresistive effect element MTJ in the direction of arrow A1 in FIG. 5, or in other words the direction from the storage layer SL toward the reference layer RL, the magnetization directions of the storage layer SL and of the reference layer RL have a parallel relationship. In a parallel state, the resistance of the magnetoresistive effect element MTJ takes the minimal value, which sets the magnetoresistive effect element MTJ to the low resistance state. This low resistance state is referred to as a "P (parallel) state", defining for example a data "0" state.

On the other hand, when a write current Ic1 greater than the write current Ic0 is passed to the magnetoresistive effect element MTJ in the direction of arrow A2 in FIG. 5, or in other words the direction from the reference layer RL toward the storage layer SL (direction opposite to arrow A1), the magnetization directions of the storage layer SL and reference layer RL have an anti-parallel relationship. In the anti-parallel state, the resistance of the magnetoresistive effect element MTJ takes the maximum value, which sets the magnetoresistive effect element MTJ into the high resistance state. This high resistance state is referred to as an "antiparallel (AP) state", defining for example a data "1" state.

The following explanation is given in accordance with the above data defining method. However, the definition of data "1" and data "0" is not limited to the above. For instance, the P state may be defined as data "1", and the AP state may be defined as data "0".

1.2 Manufacturing Method of Magnetoresistive Effect Element

Next, the manufacturing method of a memory cell array of the magnetic memory device according to the first embodiment is explained.

FIGS. 6 to 10 are schematic diagrams showing the method of manufacturing the memory cell array of the magnetic memory device according to the first embodiment.

First, the conductors 21 extending along the X-axis above the semiconductor substrate 20 are formed to be aligned along the Y-axis, as illustrated in FIG. 6. After filling the gaps between the conductors 21 with an insulator, elements 22 are formed on the top surfaces of these conductors 21. Each of the elements 22 may include stacked films corresponding to the magnetoresistive effect element MTJd, as explained by referring to (B) in FIG. 5. In the stacked film formed in the step corresponding to FIG. 6, the ferromagnet 35d is formed as an amorphous film.

Figure 7:
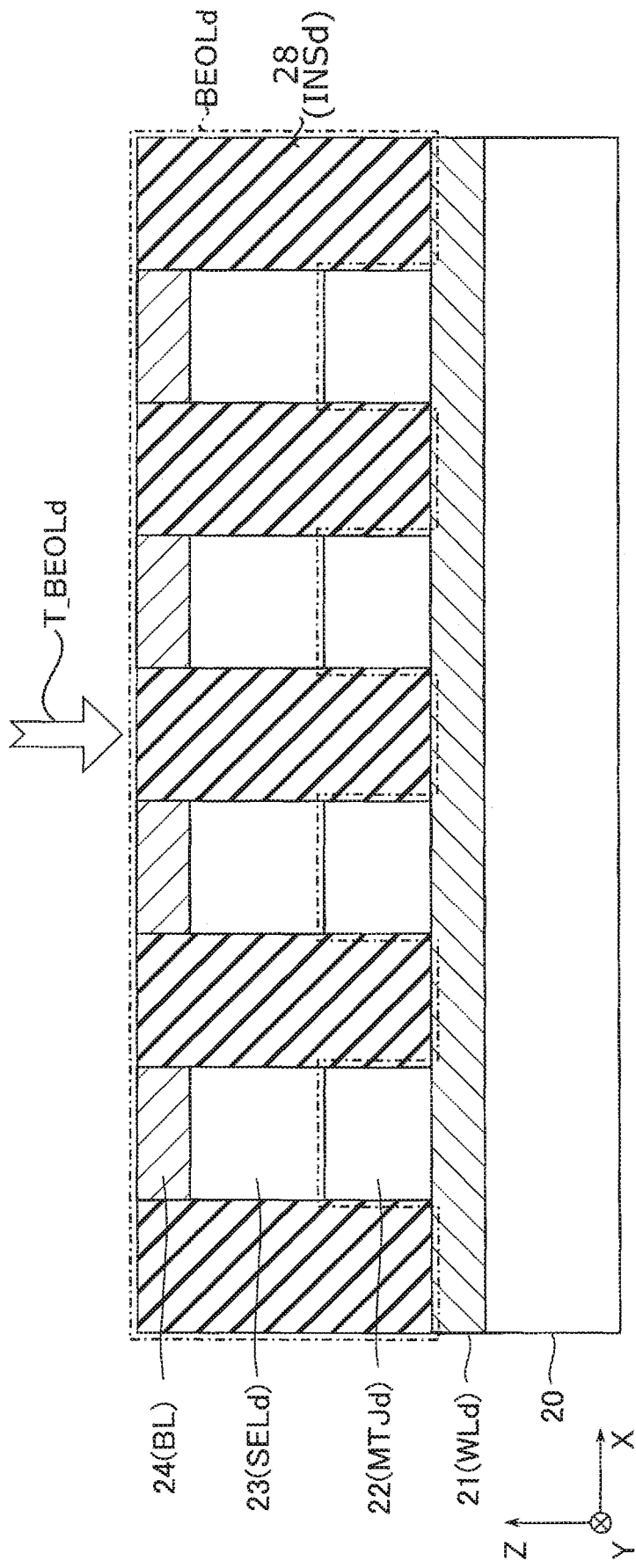
FIG. 7 is a schematic diagram showing a manufacturing method of the memory cell array of the magnetic memory device according to the first embodiment.

Next, the elements 23 are formed on the top surfaces of the elements 22, as illustrated in FIG. 7. Then, the conductors 24 are formed along the X-axis to extend along the Y-axis so that the top surfaces of the elements 23 aligned along the Y-axis can be electrically coupled to the conductors 24. An insulator 28 is arranged suitably between the elements 22, between the elements 23, and between the conductors 24 to function as an interlayer insulating film INSd.

In the process explained with reference to FIG. 7, which is conducted after the formation of the magnetoresistive effect element MTJd and before the formation of the magnetoresistive effect element MTJu, the formation of other structural components referred to as a structure BEOLd is completed. In this process, a thermal budget T_BEOLd is input to the elements 22. The "thermal budget" of a process represents the total amount of heat input to the target element from the start to the end of the process, where the unit of thermal budget may be expressed in joules (J).

Figure 8:
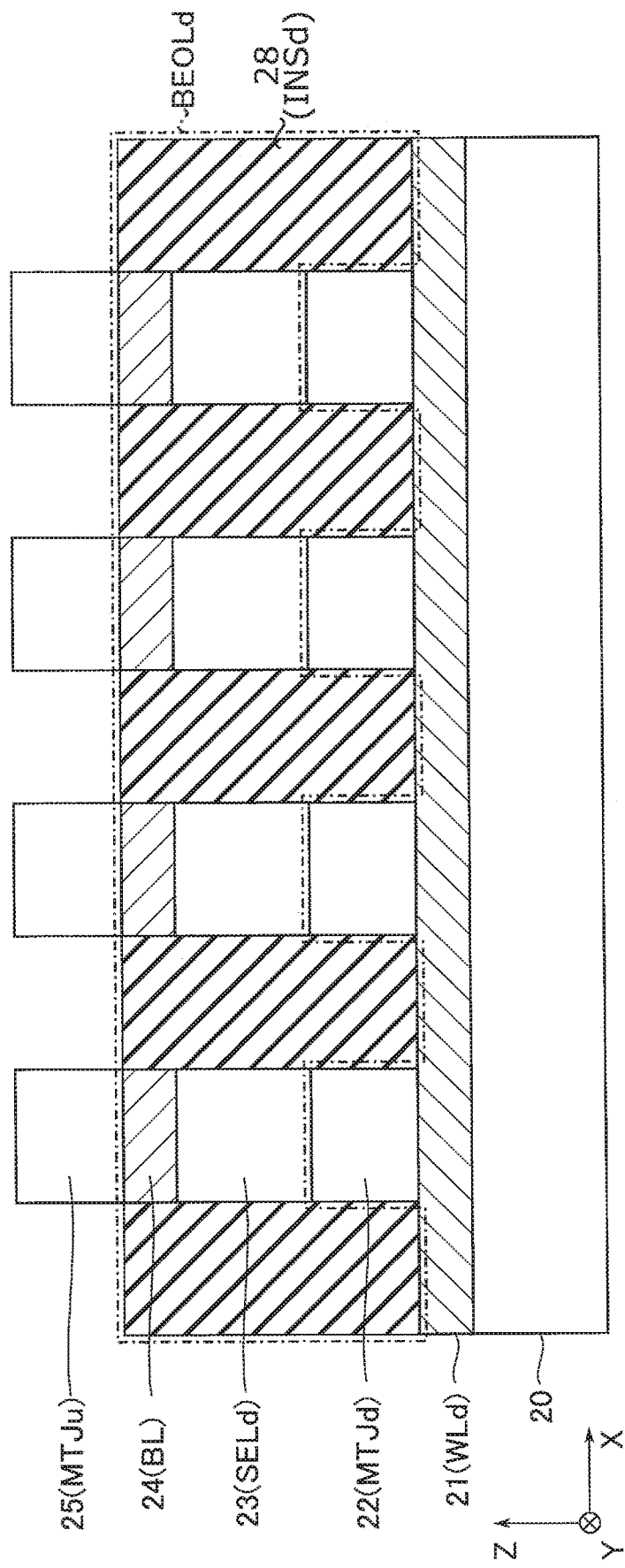
FIG. 8 is a schematic diagram showing a manufacturing method of the memory cell array of the magnetic memory device according to the first embodiment.

Thereafter, elements 25 are individually formed on the top surfaces of the conductors 24, as illustrated in FIG. 8. Each of the elements 25 includes a stacked film corresponding to the magnetoresistive effect element MTJu, as explained by referring to (A) in FIG. 5. In the stacked film formed in the process corresponding to FIG. 8, the ferromagnet 35u is formed as an amorphous film.

Figure 9:
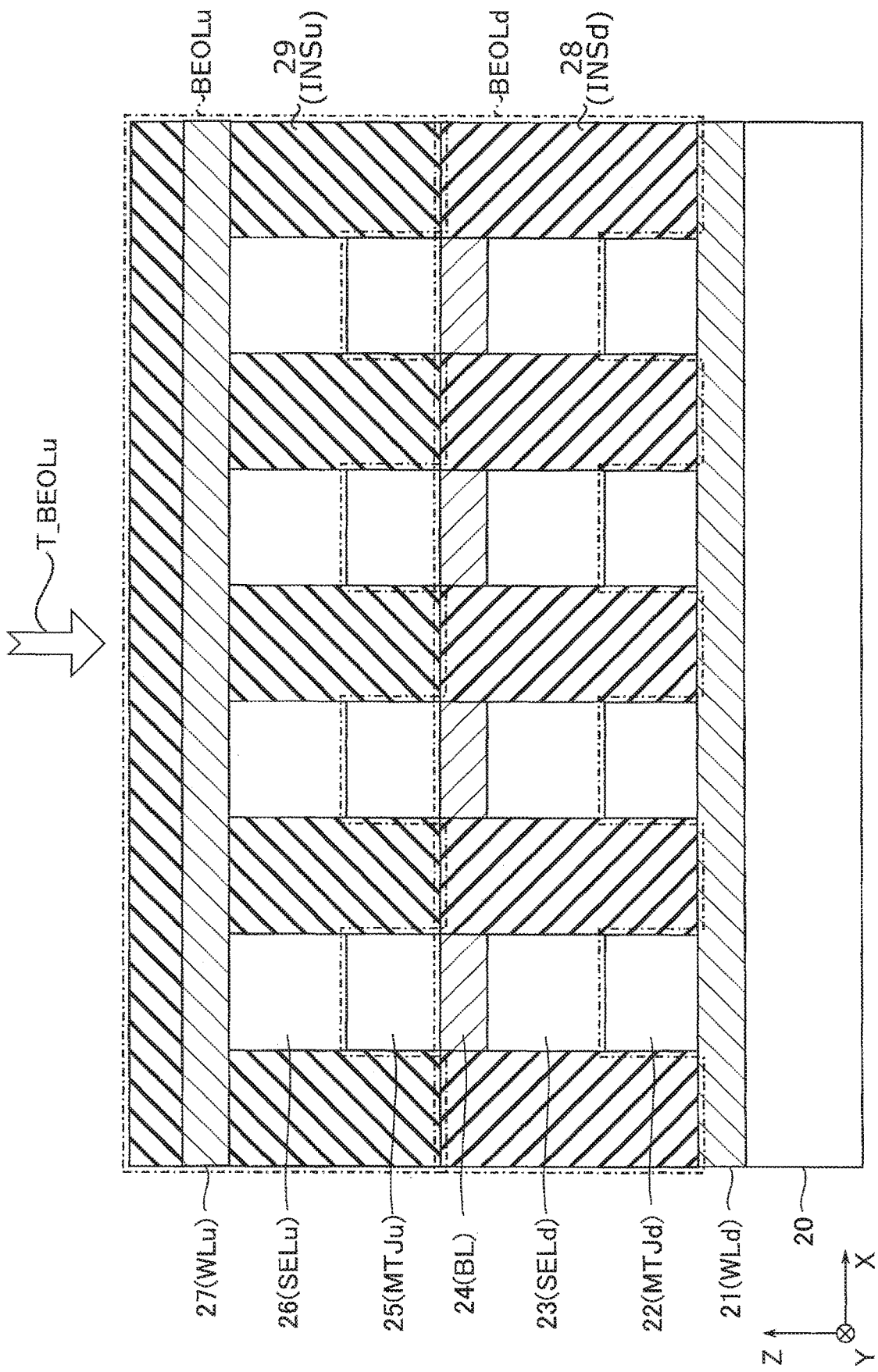
FIG. 9 is a schematic diagram showing a manufacturing method of the memory cell array of the magnetic memory device according to the first embodiment.

Next, the elements 26 are formed on the top surfaces of the elements 25, as illustrated in FIG. 9. Then, the conductors 27 are aligned in the direction of the Y-axis to extend along the X-axis in a manner such that the top surfaces of the elements 26 aligned in the direction of the X-axis can be electrically coupled to the conductors 27. Insulators 29 may be suitably arranged between the elements 25, between the elements 26, between the conductors 27, and above the conductors 27 to function as an interlayer insulating film INSu.

In the process explained by referring to FIG. 9, which is conducted after the formation of the magnetoresistive effect element MTJu and before the annealing, the formation of the remaining structure BEOLu is completed. During this process, a thermal budget T_BEOLu is input to the elements 22 and elements 25.

As explained before, the elements 22 and the elements 25 are formed to have different heat absorption rates. With regard to the thermal budget T_BEOLu (and T_BEOLd), however, unlike lamp annealing that is a heating technique in which a large amount of heat is applied rapidly in a short period of time, the layer stack on the semiconductor substrate 20 is heated over a long period of time relative to the lamp annealing. For this reason, in the formation of the structure BEOLu, the difference between the thermal budgets of the elements 22 and elements 25 observed in accordance with the difference between the heat absorption rates is negligible. Thus, the thermal budget T_BEOLu input to the elements 22 and to the elements 25 can be regarded as approximately the same, regardless of their different heat absorption rates.

Figure 10:
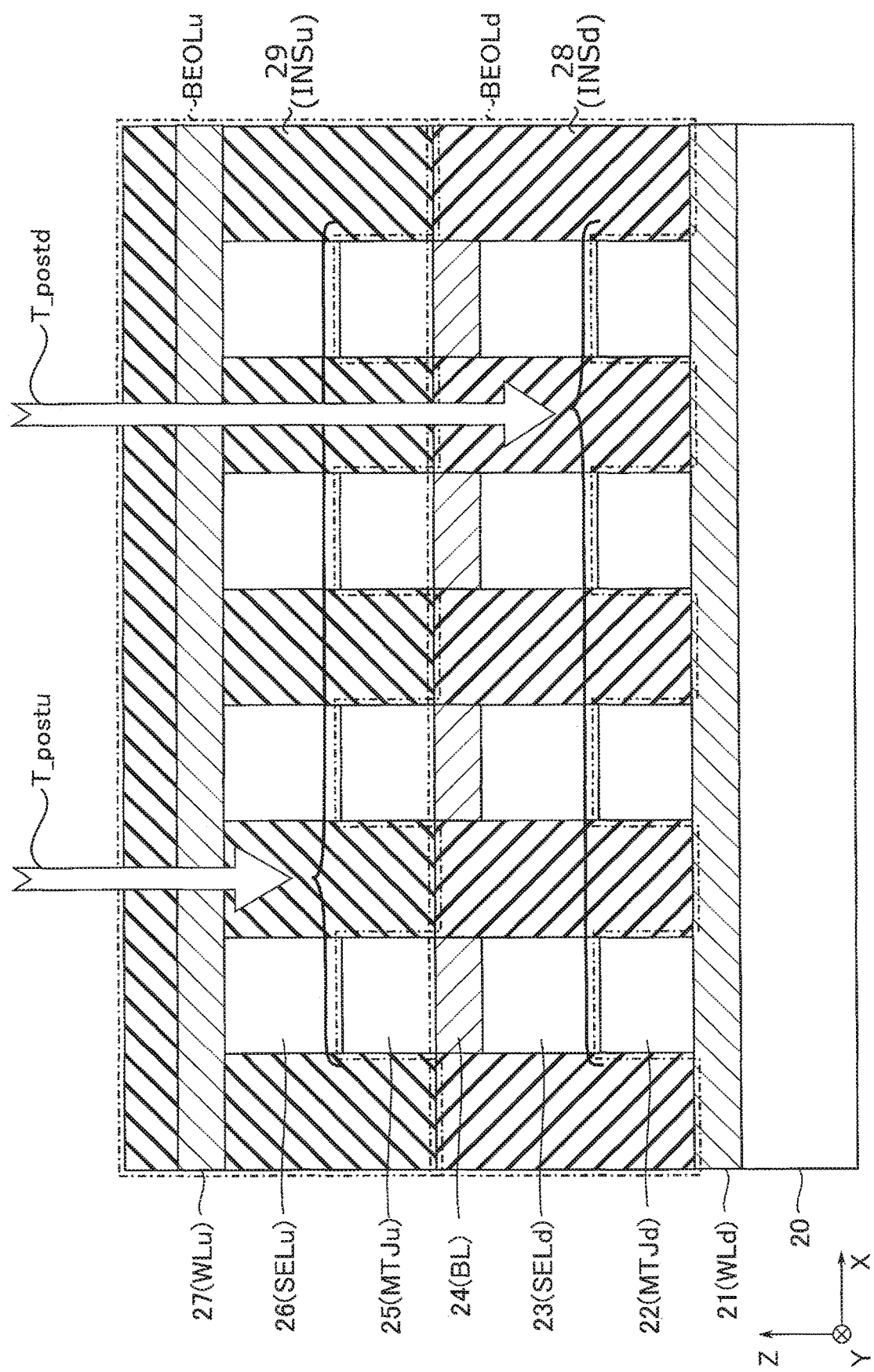
FIG. 10 is a schematic diagram showing a manufacturing method of the memory cell array of the magnetic memory device according to the first embodiment.

Next, as illustrated in FIG. 10, the structure formed in the above process is heated by annealing, which transforms the ferromagnet 35d (and 37d) of the elements 22 and the ferromagnet 35u (and 37u) of the elements 25 from amorphous to crystalline. In this manner, the elements 22 and elements 25 attain the properties of the magnetoresistive effect elements MTJd and MTJu, respectively.

For the above annealing process, lamp annealing is conducted by providing a large amount of heat rapidly in a short period of time. For this purpose, thermal budgets T_postd and T_postu are input to the elements 22 and elements 25, respectively, corresponding to their heat absorption rates. This means that the thermal budget T_postd input to the elements 22 is smaller than the thermal budget T_postu input to the elements 25.

In view of the above, the total thermal budget Td (=T_BEOLd+T_BEOLu+T_postd) is input to the elements 22, the total thermal budget Tu (=T_BEOLu+T_postu) is input to the elements 25, and the process of manufacturing the memory cell array 10 is completed.

In the above example, annealing is conducted after forming the conductor 27, but the process order is not limited thereto. For instance, annealing may be conducted after forming the elements 26 and before forming the conductors 27. If this is the case, when inputting the thermal budgets T_postu and T_postd from above the magnetic memory device 1 to the elements 22 and 25 during the annealing, no conductor 27 would be present so that the input of the thermal budgets to the elements 22 and 25 would not be obstructed and the input would not be reduced from the certain targeted amount.

1.3 Effects of Present Embodiment

According to the first embodiment, variations can be suppressed in the properties of the magnetoresistive effect elements formed in different layers. The effects of the present embodiment will be described below.

The magnetoresistive effect element MTJd is arranged below the magnetoresistive effect element MTJu. This means that the magnetoresistive effect element MTJd receives more heat for the amount of the thermal budget T_BEOLd than the magnetoresistive effect element MTJu, where the thermal budget T_BEOLd is input during the process for preparing other films of the structure, after forming the magnetoresistive effect element MTJd and before forming the magnetoresistive effect element MTJu. If the magnetoresistive effect elements MTJu and MTJd are designed to have approximately the same heat absorption rate, the total thermal budgets Tu and Td will produce a difference expressed by the thermal budget T_BEOLd before the annealing, which may cause a difference between the properties of the magnetoresistive effect elements MTJu and MTJd.

According to the first embodiment, the nonmagnet 32d is designed to have a heat absorption rate smaller than that of the nonmagnet 32u. In particular, if the nonmagnet 32d is formed to mainly contain ruthenium (Ru), the nonmagnet 32u is formed to mainly contain tantalum (Ta), which has a greater heat absorption rate than ruthenium (Ru). In this manner, under the application of a certain amount of heat for a short period of time by annealing, the thermal budget T_postd input to the magnetoresistive effect element MTJd becomes smaller than the thermal budget T_postu input to the magnetoresistive effect element MTJu (T_postd<T_postu). By suitably setting the difference between the thermal budget T_postd and the thermal budget T_postu (for example, by bringing it close to T_BEOLd), the total thermal budget Td (=T_BEOLd+T_BEOLu+T_postd) input to the magnetoresistive effect element MTJd can be set to approximately the same value as the total thermal budget Tu (=T_BEOLu+T_postu) input to the magnetoresistive effect element MTJu when manufacturing the memory cell array 10.

A further explanation is provided below with reference to FIG. 11.

Figure 11:
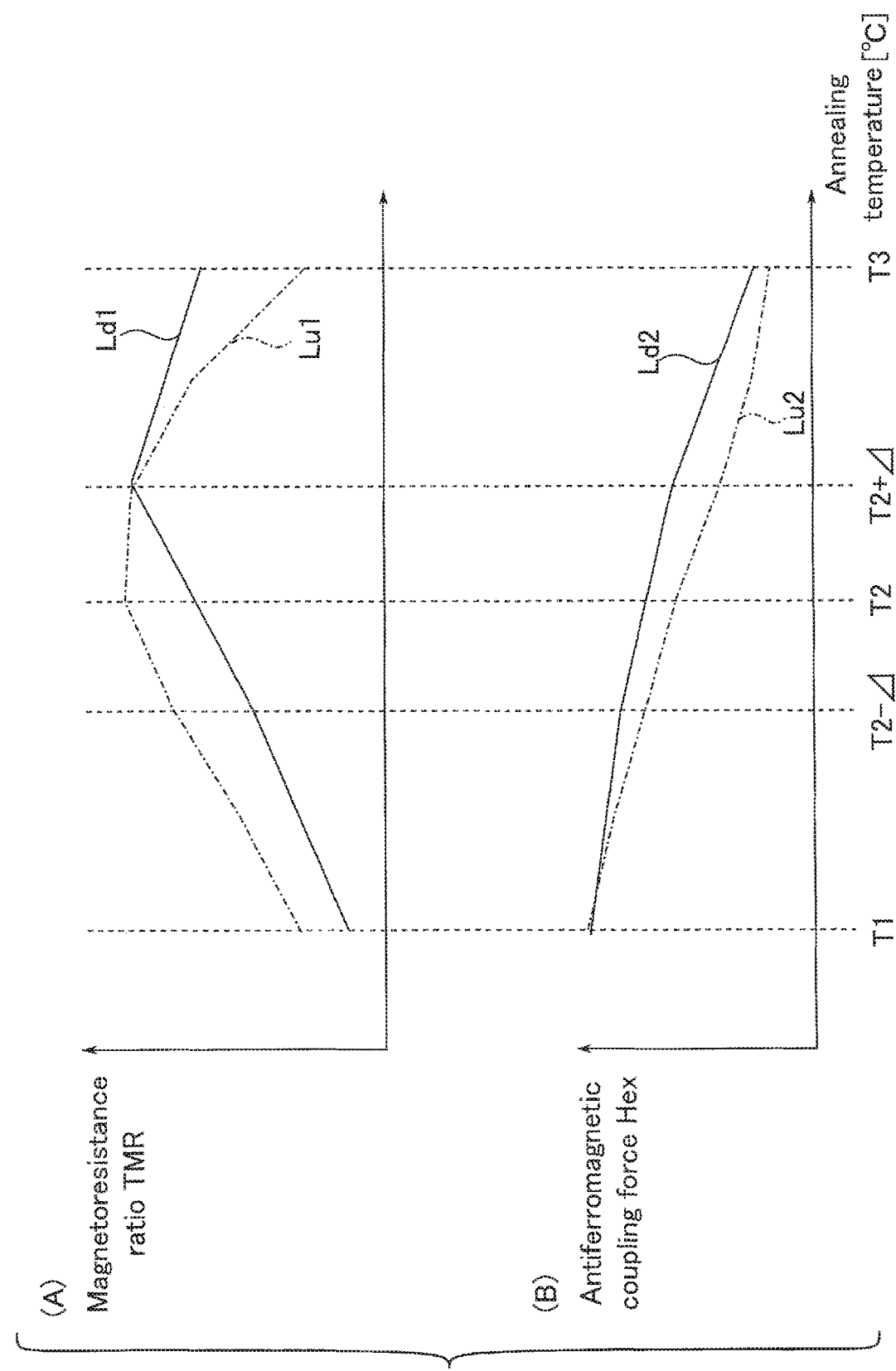
FIG. 11 is a schematic diagram showing effects of the first embodiment.

FIG. 11 is a diagram showing the effects of the first embodiment. The horizontal axis of FIG. 11 represents the temperature of the heat applied to the magnetoresistive effect element MTJ during annealing, while the vertical axis represents the properties of two different magnetoresistive effect elements MTJ having different heat absorption rates when the annealing temperature is changed from T1 to T3. In particular, line Lu1 represents the change of the magnetoresistance ratio TMRu of magnetoresistive effect element MTJu having a higher heat absorption rate, while line Ld1 represents the change of the magnetoresistance ratio TMRd of magnetoresistive effect element MTJd having a lower heat absorption rate in (A) of FIG. 11. Line Lu2 in (B) of FIG. 11 represents the change of an antiferromagnetic coupling force Hexu of magnetoresistive effect element MTJu having a higher heat absorption rate, while line Ld2 represents the change of an antiferromagnetic coupling force Hexd of megnetoresistive effect element MTJd having a lower heat absorption rate. In the example of FIG. 11, it is considered that the same amount of thermal budget T_BEOL is input to the magnetoresistive effect elements MTJu and MTJd when forming films (or in other words, no thermal budget other than the thermal budget for annealing will be taken into consideration).

In (A) of FIG. 11, line Ld1 representing the change of the magnetoresistance ratio TMRd is shifted toward the right of the drawing sheet (to the positive side of the vertical axis) with respect to line Lu1 representing the change of the magnetoresistance ratio TMRu so that a response to the annealing temperature can be delayed. Specifically, the magnetoresistance ratio TMRd under the heat application at an annealing temperature T2 is approximately the same as the magnetoresistance ratio TMRu under the heat application at an annealing temperature (T2−Δ), and the magnetoresistance ratio TMRd under the heat application at an annealing temperature (T2+Δ) is approximately the same as the magnetoresistance ratio TMRu under the heat application at the annealing temperature T2 (where Δ>0).

Furthermore, in (B) of FIG. 11, line Ld2 representing the change of the antiferromagnetic coupling force Hexd is shifted toward the right of the drawing sheet (to the positive side of the vertical axis) with respect to line Lu2 representing the change of the antiferromagnetic coupling force Hexu so that a response to the annealing temperature can be delayed. Specifically, the antiferromagnetic coupling force Hexd under the heat application at the annealing temperature T2 is approximately the same as the antiferromagnetic coupling force Hexu under the heat application at the annealing temperature (T2−Δ), and the antiferromagnetic coupling force Hexd under the heat application at the annealing temperature (T2+Δ) is approximately the same as the antiferromagnetic coupling force Hexu under the heat application at the annealing temperature T2.

In this manner, by setting different values to the heat absorption rates of the magnetoresistive effect elements MTJu and MTJd, different thermal budgets can be input for the annealing. Thus, a difference expressed by T_BEOLd created between the heat budgets of the magnetoresistive effect elements MTJ formed in different layers can be compensated, bringing the total thermal budgets Tu and Td to approximately the same values. As a result, variations in the properties of the magnetoresistive effect elements MTJ can be reduced.

1.4 First Modification

In the above explanation of the first embodiment, the heat absorption layer HAL is formed above the storage layer SL in a top-free structure in which the storage layer SL is arranged above the reference layer RL, but the structure is not limited thereto. For example, the heat absorption layer HAL may be arranged below the storage layer SL in the top-free structure. In the following explanation, the points different from the first embodiment will be focused on for the sake of convenience.

Figure 12:
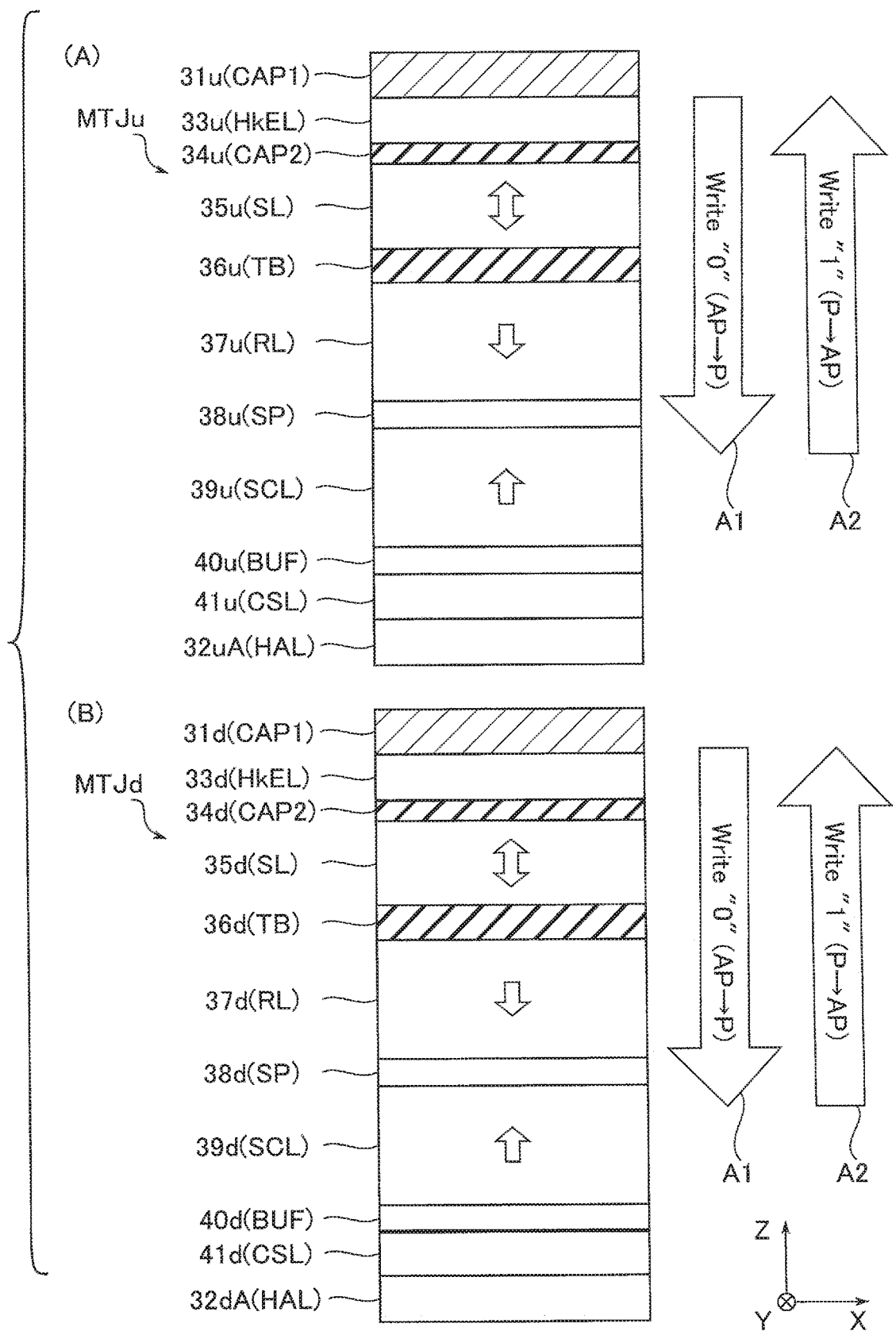
FIG. 12 is a schematic diagram showing a configuration of a magnetoresistive effect element in a magnetic memory device according to a first modification of the first embodiment.

FIG. 12 is a cross section of a configuration of a magnetoresistive effect element in a magnetic memory device according to a first modification of the first embodiment, which corresponds to the configuration of the first embodiment illustrated in FIG. 5.

In the magnetoresistive effect element MTJu as illustrated in FIG. 12, a plurality of films are arranged, namely, a nonmagnet 32uA functioning as the heat absorption layer HAL, a nonmagnet 41u functioning as a crystal separation layer CSL, the nonmagnet 40u, the ferromagnet 39u, the nonmagnet 38u, the ferromagnet 37u, the nonmagnet 36u, the ferromagnet 35u, the nonmagnet 34u, a nonmagnet 33u, and a nonmagnet 31u, in this order from the bit line BL side to the word line WLu side (in the direction of the Z-axis). In the magnetoresistive effect element MTJd, a plurality of films are arranged, namely, a nonmagnet 32dA functioning as a heat absorption layer HAL, a nonmagnet 41d functioning as the crystal separation layer CSL, the nonmagnet 40d, the ferromagnet 39d, the nonmagnet 38d, the ferromagnet 37d, the nonmagnet 36d, the ferromagnet 35d, the nonmagnet 34d, the nonmagnet 33d, and the nonmagnet 31d in this order from the side of the word line WLd to the side of the bit line BL (in the direction of the Z-axis).

If the nonmagnet 32dA is arranged n layers apart from the nonmagnet 36d, the nonmagnet 32uA is also formed n layers apart from the nonmagnet 36u (where n is an integer larger than or equal to 1). In the example of FIG. 12, the nonmagnets 32uA and 32dA are formed five layers apart, downwardly from the nonmagnets 36u and 36d along the Z-axis. The nonmagnets 32uA and 32dA are substantially the same as the nonmagnets 32u and 32d according to the first embodiment, except for the levels in which these components are positioned, and the explanation is therefore omitted.

The nonmagnets 41u and 41d are amorphous layers, having a function of dividing the crystalline structures in the layers immediately above and below. Preferably, the nonmagnets 41u and 41d maintain the amorphous state without becoming crystallized by annealing (at a temperature as high as 400 degrees Celsius, for example). For this purpose, the nonmagnets 41u and 41d may contain hafnium boride (HfB).

With the above configuration, even when the heat absorption layer HAL is arranged below the storage layer SL, the crystallization in each layer of the magnetoresistive effect element MTJ can be maintained. As a result, different heat absorption rates can be set for the upper magnetoresistive effect element MTJu and for the lower magnetoresistive effect element MTJd, while maintaining properties such as magnetic anisotropy and magnetoresistance ratio.

1.5 Second Modification

In the above explanation of the first embodiment, the capping layer CAP1 is arranged on top of the heat absorption layer HAL in the top-free structure, but the arrangement is not limited thereto. For example, a capping layer CAP1 may not necessarily be formed. In the following explanation, the points different from the first embodiment will be focused on for the sake of convenience.

Figure 13:
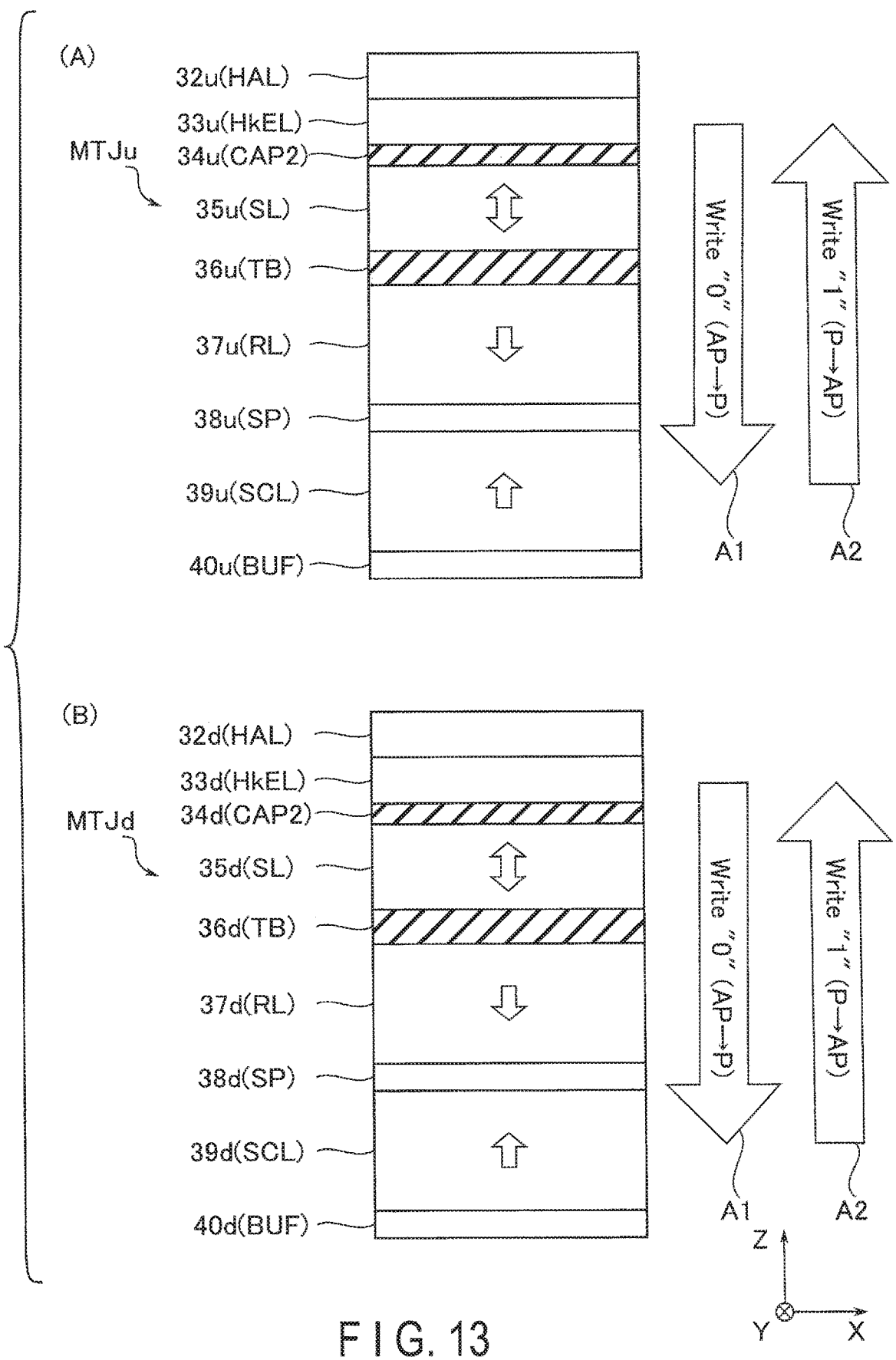
FIG. 13 is a schematic diagram showing a configuration of a magnetoresistive effect element in a magnetic memory device according to a second modification of the first embodiment.

FIG. 13 is a cross section of a configuration of a magnetoresistive effect element in a magnetic memory device according to a second modification of the first embodiment, which corresponds to the configuration of the first embodiment illustrated in FIG. 5.

As illustrated in FIG. 13, the nonmagnets 32u and 32d are formed as the topmost layers in the magnetoresistive effect elements MTJu and MTJd, respectively, according to the second modification example of the first embodiment. In this structure, different heat absorption rates can be set for the magnetoresistive effect element MTJu and for the magnetoresistive effect element MTJd, thereby obtaining effects similar to the first embodiment.

2. Second Embodiment

A magnetic memory device according to a second embodiment will be described below. The magnetoresistive effect element MTJ according to the first embodiment has a top-free structure. According to the second embodiment, the magnetoresistive effect element MTJ has a bottom-free structure. In the magnetoresistive effect element MTJ with a bottom-free structure, the storage layer SL is formed below the reference layer.

2.1 Magnetoresistive Effect Element

A configuration of a magnetoresistive effect element according to the second embodiment is explained with reference to FIG. 14. A cross section of the configuration of the magnetoresistive effect element in the magnetic memory device according to the second embodiment is presented in FIG. 14, which corresponds to the configuration of the first embodiment illustrated in FIG. 5.

Figure 14:
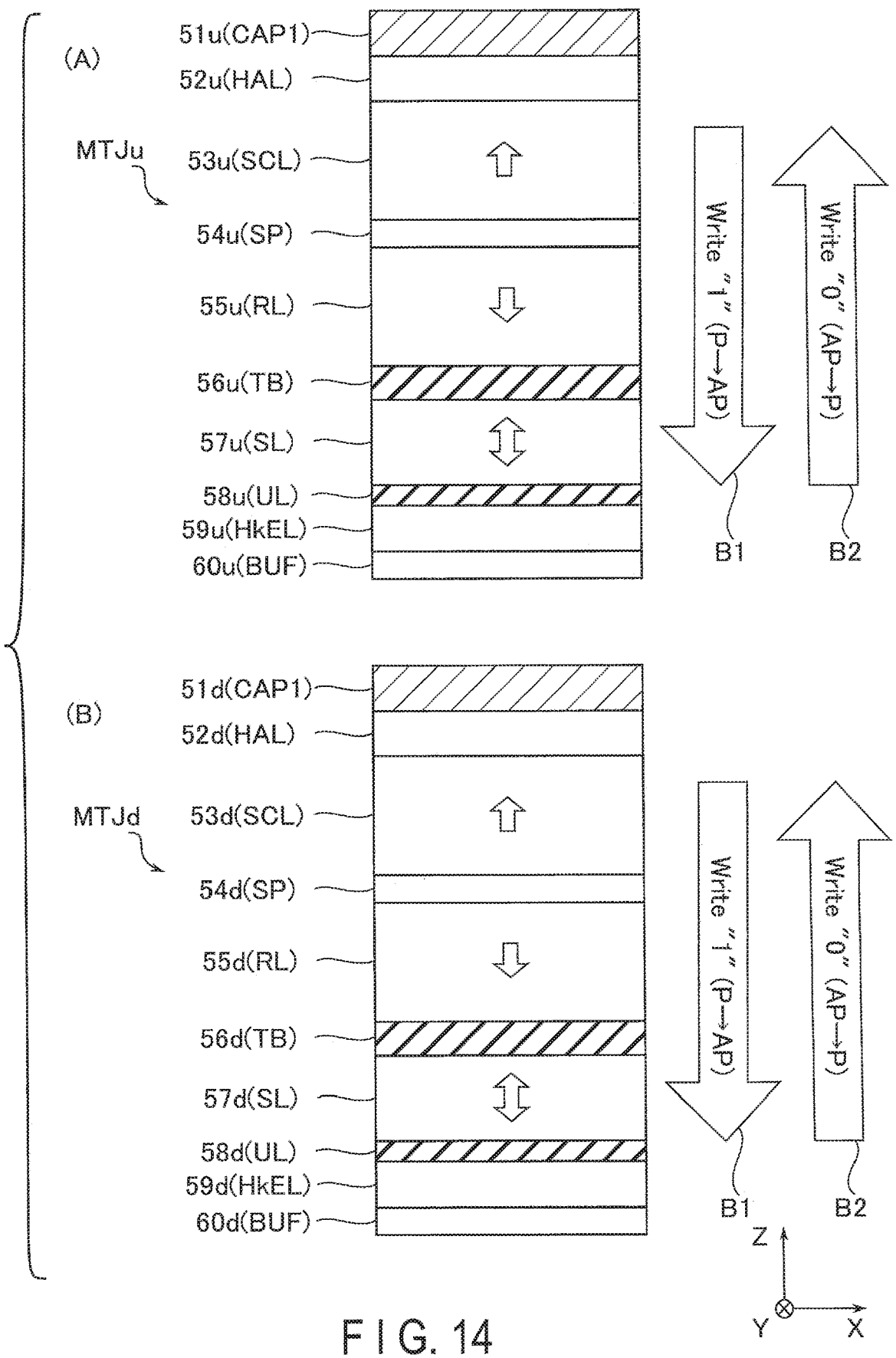
FIG. 14 is a schematic diagram showing a configuration of a magnetoresistive effect element in a magnetic memory device according to a second embodiment.

As illustrated in FIG. 14, the magnetoresistive effect element MTJu may include a nonmagnet 51u functioning as a capping layer CAP1, a nonmagnet 52u functioning as a heat absorption layer HAL, a ferromagnet 53u functioning as a shift cancelling layer SCL, a nonmagnet 54u functioning as a spacer layer, a ferromagnet 55u functioning as a reference layer RL, a nonmagnet 56u functioning as a tunnel barrier layer TB, a ferromagnet 57u functioning as a storage layer SL, a nonmagnet 58u functioning as an underlayer UL, a nonmagnet 59u functioning as an Hk enhancement layer HkEL, and a nonmagnet 60u functioning as a buffer layer BUF. The magnetoresistive effect element MTJd may include a nonmagnet 51d functioning as a capping layer CAP1, a nonmagnet 52d functioning as a heat absorption layer HAL, a ferromagnet 53d functioning as a shift cancelling layer SCL, a nonmagnet 54d functioning as a spacer layer, a ferromagnet 55d functioning as a reference layer RL, a nonmagnet 56d functioning as a tunnel barrier layer TB, a ferromagnet 57d functioning as a storage layer SL, a nonmagnet 58d functioning as an underlayer UL, a nonmagnet 59d functioning as an Hk enhancement layer HkEL, and a nonmagnet 60d functioning as a buffer layer BUF.

If the nonmagnet 52d is arranged n layers apart from the nonmagnet 56d, the nonmagnet 52u is also formed n layers apart from the nonmagnet 56u (where n is an integer larger than or equal to 1). In the example of FIG. 14, the nonmagnets 52u and 52d are formed three layers apart from the nonmagnets 56u and 56d along the Z-axis.

The capping layer CAP1, shift cancelling layer SCL, spacer layer SP, reference layer RL, tunnel barrier layer TB, storage layer SL, Hk enhancement layer HkEL, and buffer layer BUF are the same as those in the first embodiment. In addition, these layers have the same structures between the magnetoresistive effect element MTJu and the magnetoresistive effect element MTJd. The underlayer UL is substantially the same as the capping layer CAP2 according to the first embodiment, and has the same structure for the magnetoresistive effect elements MTJu and MTJd. On the other hand, the heat absorption layer HAL has a higher heat absorption rate in the magnetoresistive effect element MTJu than in the magnetoresistive effect element MTJd.

In the above bottom-free structure, the magnetoresistive effect element MTJ can be configured to include the heat absorption layer HAL above the storage layer SL in a similar manner to the top-free structure. In this manner, different heat absorption rates can be set for the upper magnetoresistive effect element MTJu and for the lower magnetoresistive effect element MTJd, which can reduce variations in the properties between the two elements.

2.2 First Modification

According to the second embodiment, the bottom-free structure in which the heat absorption layer HAL is arranged above the storage layer SL has been explained, but the structure is not limited thereto. For example, the heat absorption layer HAL may be arranged below the storage layer SL in the bottom-free structure. In the following explanation, the points different from the second embodiment will be focused on for the sake of convenience.

Figure 15:
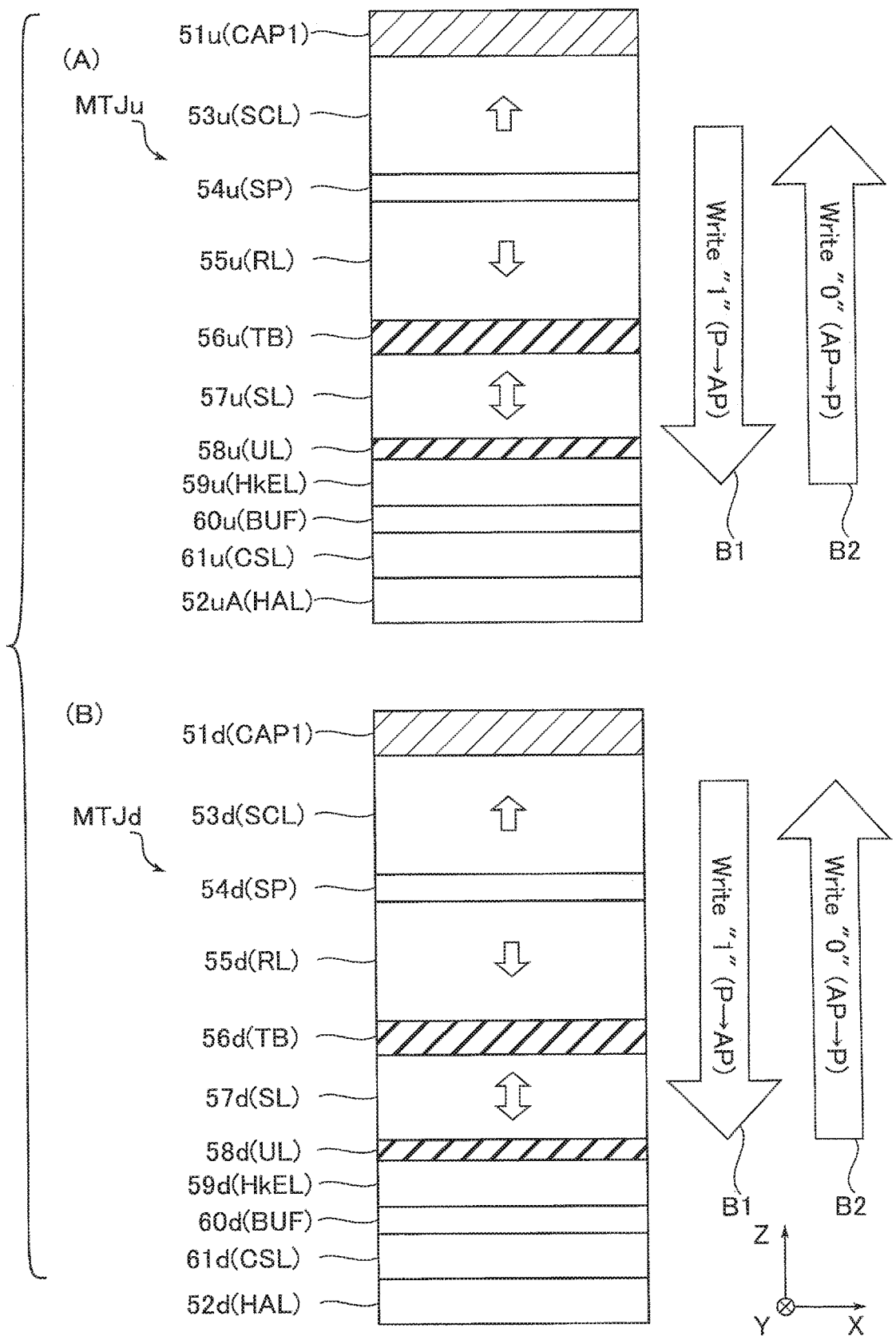
FIG. 15 is a schematic diagram showing a configuration of a magnetoresistive effect element in a magnetic memory device according to a first modification of the second embodiment.

FIG. 15 is a cross section of a configuration of a magnetoresistive effect element in a magnetic memory device according to a first modification example of the second embodiment, which corresponds to the configuration of the second embodiment illustrated in FIG. 14.

In the magnetoresistive effect element MTJu as illustrated in FIG. 15, a plurality of films are arranged, namely, a nonmagnet 52uA functioning as a heat absorption layer HAL, a nonmagnet 61u functioning as a crystal separation layer CSL, a nonmagnet 60u, a nonmagnet 59u, a nonmagnet 58u, a ferromagnet 57u, a nonmagnet 56u, a ferromagnet 55u, a nonmagnet 54u, a ferromagnet 53u, and a nonmagnet 51u in this order from the bit line BL side toward the word line WLu side (in the direction of the Z-axis). In the magnetoresistive effect element MTJd, a plurality of films are arranged, namely, a nonmagnet 52dA functioning as a heat absorption layer HAL, a nonmagnet 61d functioning as a crystal separation layer CSL, a nonmagnet 60d, a nonmagnet 59d, a nonmagnet 58d, a ferromagnet 57d, a nonmagnet 56d, a ferromagnet 55d, a nonmagnet 54d, a ferromagnet 53d, and a nonmagnet 51d, in this order from the word line WLd side toward the bit line BL side (in the direction of the Z-axis).

If the nonmagnet 52dA is arranged n layers apart from the nonmagnet 56d, the nonmagnet 52uA is also formed n layers apart from the nonmagnet 56u (where n is an integer larger than or equal to 1). In the example of FIG. 15, the nonmagnets 52uA and 52dA are formed five layers apart downwardly from the nonmagnets 56u and 56d along the Z-axis. The nonmagnets 52uA and 52dA are substantially the same as the nonmagnets 52u and 52d according to the second embodiment, except for the levels in which these components are positioned, and the explanation thereof is omitted.

The nonmagnets 61u and 61d are amorphous, having a function of dividing the crystalline structures in the layers immediately above and below. Preferably, the nonmagnets 61u and 61d maintain the amorphous state, without becoming crystallized by annealing (under a temperature as high as 400 degrees Celsius, for example). For this purpose, the nonmagnets 61u and 61d may contain hafnium boride (HfB).

With the above configuration, even when the heat absorption layer HAL is arranged below the storage layer SL, the crystallization in each layer of the magnetoresistive effect elements MTJ can be maintained. As a result, while maintaining properties such as magnetic anisotropy and magnetoresistance ratio, different heat absorption rates can be set for the upper magnetoresistive effect element MTJu and for the lower magnetoresistive effect element MTJd.

2.3 Second Modification

In the second embodiment, the bottom-free structure in which the capping layer CAP1 is arranged above the heat absorption layer HAL has been explained, but the arrangement is not limited thereto. For example, a capping layer CAP1 may not need to be formed. In the following explanation, the points different from the second embodiment will be focused on for the sake of convenience.

Figure 16:
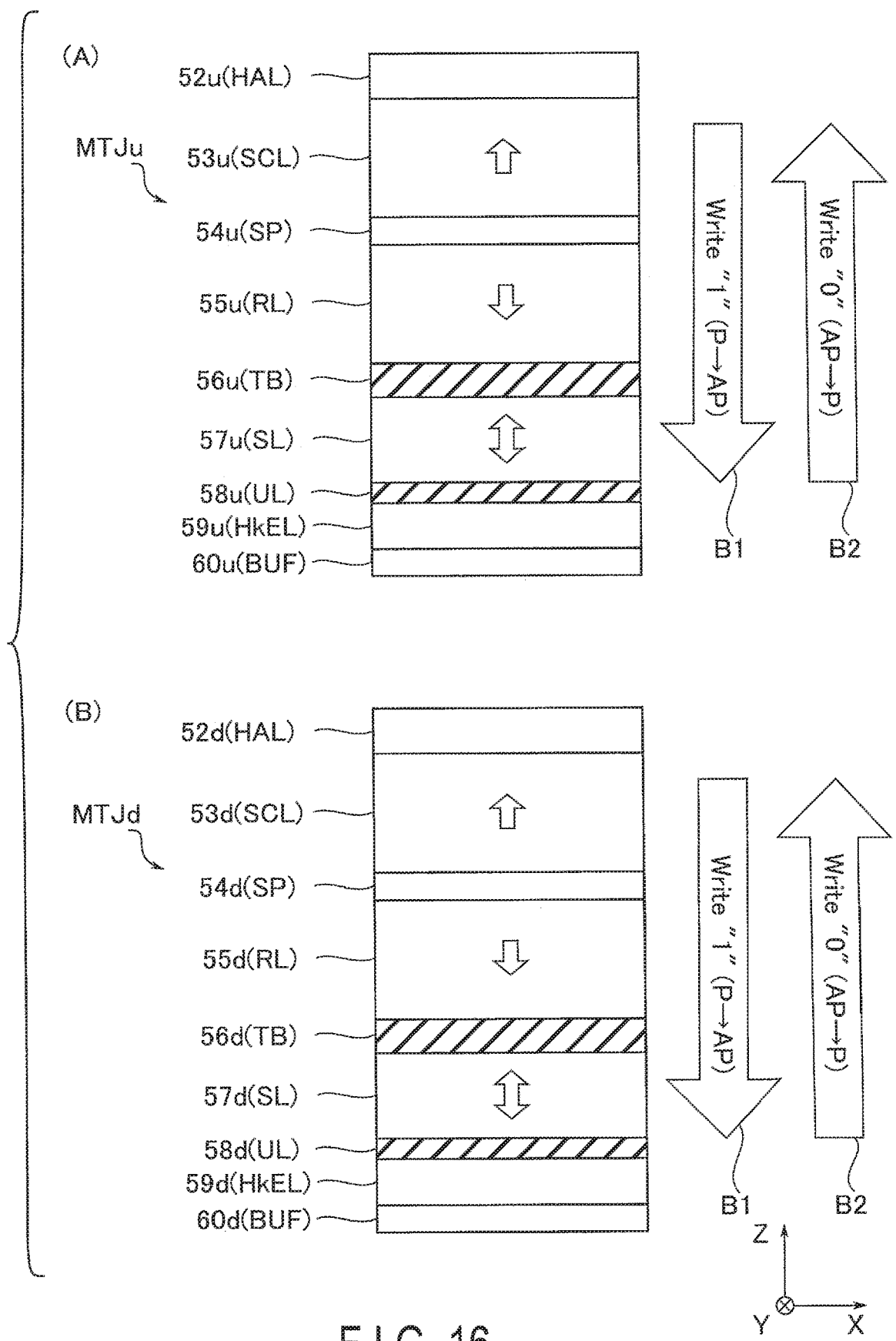
FIG. 16 is a schematic diagram showing a configuration of a magnetoresistive effect element in a magnetic memory device according to a second modification of the second embodiment.

FIG. 16 is a cross section of a configuration of a magnetoresistive effect element in a magnetic memory device according to a second modification example of the second embodiment, which corresponds to the configuration of the second embodiment illustrated in FIG. 14.

As illustrated in FIG. 16, the nonmagnets 52u and 52d are formed as the topmost layer in each of the magnetoresistive effect elements MTJu and MTJd, respectively, according to the second modification example of the second embodiment. In this structure, different heat absorption rates can be set for the magnetoresistive effect element MTJu and for the magnetoresistive effect element MTJd, thereby obtaining effects similar to the second embodiment.

3. Others

The first and second embodiments are not limitations, but various other modifications may be applied.

According to the first and second embodiments, different materials are adopted to attain different heat absorption rates for the upper heat absorption layer HAL and the lower heat absorption layer HAL, but this is not a limitation. For example, the upper heat absorption layer HAL may be configured to have a greater film thickness than the lower heat absorption layer HAL, regardless of whether or not the upper heat absorption layer HAL mainly contains the same element as that of the lower heat absorption layer HAL. In this manner, the heat absorption rate of the upper heat absorption layer HAL can be set higher than the heat absorption rate of the lower heat absorption layer HAL. This can set different heat budgets to be input during annealing, thereby compensating the difference expressed by T_BEOLd created between the heat budgets of the layers in the magnetoresistive effect elements MTJu and MTJd. As a result, the total thermal budgets Tu and Td can be brought to approximately the same value, reducing the variations in the properties of the magnetoresistive effect elements MTJu and MTJd.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A magnetic memory device comprising:
   a substrate;
   a first layer stack; and
   a second layer stack at a same side of the first layer stack relative to the substrate, and farther than the first layer stack from the substrate,
   wherein each of the first layer stack and the second layer stack includes:
   a reference layer;
   a tunnel barrier layer provided in a direction relative to the reference layer, the direction being perpendicular to the substrate;
   a storage layer provided in the direction relative to the tunnel barrier layer; and
   a first nonmagnetic layer provided in the direction relative to the storage layer,
   wherein a heat absorption rate of the first nonmagnetic layer of the first layer stack is lower than a heat absorption rate of the first nonmagnetic layer of the second layer stack.

2. The device of claim 1, wherein the first nonmagnetic layer of the first layer stack includes an element different from an element of the first nonmagnetic layer of the second layer stack.

3. The device of claim 2, wherein the first nonmagnetic layer of the first layer stack includes ruthenium (Ru), and the first nonmagnetic layer of the second layer stack includes tantalum (Ta).

4. The device of claim 1, wherein the first nonmagnetic layer of the first layer stack has a film thickness different from a film thickness of the first nonmagnetic layer of the second layer stack.

5. The device of claim 4, wherein the film thickness of the first nonmagnetic layer of the first layer stack is smaller than the film thickness of the first nonmagnetic layer of the second layer stack.

6. The device of claim 1, wherein
   each of the first layer stack and the second layer stack further includes:
   a second nonmagnetic layer between the storage layer and the first nonmagnetic layer, the second nonmagnetic layer including an oxide; and
   a third nonmagnetic layer between the first nonmagnetic layer and the second nonmagnetic layer, the third nonmagnetic layer including at least one element selected from ruthenium (Ru), iridium (Ir), rhodium (Rh), molybdenum (Mo), iron (Fe), and cobalt (Co).

7. The device of claim 6, wherein each of the first layer stack and the second layer stack further includes a fourth nonmagnetic layer including a metal, and the fourth nonmagnetic layer is farther than the reference layer, the tunnel barrier layer, the first nonmagnetic layer, the second nonmagnetic layer, and the third nonmagnetic layer from the substrate.

8. The device of claim 1, wherein each of the first layer stack and the second layer stack further includes a shift cancelling layer and a spacer layer, the reference layer is provided in the direction relative to the shift cancelling layer, and the spacer layer is provided between the reference layer and the shift cancelling layer, the spacer layer including at least one element selected from ruthenium (Ru), osmium (Os), iridium (Ir), vanadium (V), and chrome (Cr).

9. The device of claim 1, wherein the second layer stack is provided in the direction relative to the first layer stack.

10. The device of claim 1, wherein the first layer stack is provided in the direction relative to the second layer stack.

11. A magnetic memory device comprising:

a substrate;

a first layer stack; and a second layer stack at a same side of the first layer stack relative to the substrate, and farther than the first layer stack from the substrate, wherein each of the first layer stack and the second layer stack includes:

a first nonmagnetic layer;

a reference layer provided in a direction relative to the first nonmagnetic layer, the direction being perpendicular to the substrate;

a tunnel barrier layer provided in the direction relative to the reference layer; and a storage layer provided in the direction relative to the tunnel barrier layer, wherein a heat absorption rate of the first nonmagnetic layer of the first layer stack is lower than a heat absorption rate of the first nonmagnetic layer of the second layer stack.

12. The device of claim 11, wherein the first nonmagnetic layer of the first layer stack includes ruthenium (Ru), and the first nonmagnetic layer of the second layer stack includes tantalum (Ta).

13. The device of claim 11, wherein the film thickness of the first nonmagnetic layer of the first layer stack is smaller than the film thickness of the first nonmagnetic layer of the second layer stack.

14. The device of claim 11, wherein each of the first layer stack and the second layer stack further includes a shift cancelling layer and a spacer layer, the reference layer is provided in the direction relative to the shift cancelling layer, and the spacer layer is provided between the reference layer and the shift cancelling layer, the spacer layer including at least one element selected from ruthenium (Ru), osmium (Os), iridium (Ir), vanadium (V), and chrome (Cr).

15. The device of claim 11, wherein the storage layer and the reference layer includes at least one element selected from iron (Fe), cobalt (Co), and nickel (Ni).

16. The device of claim 11, wherein the storage layer has:

a first resistance value in response to a first current from the storage layer to the reference layer, and a second resistance value in response to a second current from the reference layer to the storage layer.

17. The device of claim 16, wherein the first resistance value is smaller than the second resistance value.

18. The device of claim 11, wherein each of the first layer stack and the second layer stack includes a switching element coupled in series to the storage layer, the reference layer, and the tunnel barrier layer.

19. The device of claim 1, wherein the storage layer and the reference layer includes at least one element selected from iron (Fe), cobalt (Co), and nickel (Ni).

20. The device of claim 1, wherein the storage layer has:

a first resistance value in response to a first current from the storage layer to the reference layer, and a second resistance value in response to a second current from the reference layer to the storage layer.

* * * * *